(12) United States Patent
Yun et al.

(10) Patent No.: US 11,839,096 B2
(45) Date of Patent: Dec. 5, 2023

(54) ORGANIC SENSORS AND ELECTRONIC DEVICES

(71) Applicant: Samsung Electronics Co., Ltd., Suwon-si (KR)

(72) Inventors: Sung Young Yun, Suwon-si (KR); Sung Jun Park, Yongin-si (KR); Chul Joon Heo, Busan (KR); Kyung Bae Park, Hwaseong-si (KR); Gae Hwang Lee, Seongnam-si (KR); Yong Wan Jin, Seoul (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 0 days.

(21) Appl. No.: 16/693,831

(22) Filed: Nov. 25, 2019

(65) Prior Publication Data
US 2020/0395564 A1 Dec. 17, 2020

(30) Foreign Application Priority Data
Jun. 14, 2019 (KR) .................. 10-2019-0070954

(51) Int. Cl.
*H10K 30/88* (2023.01)
*H01L 27/146* (2006.01)
*H10K 30/20* (2023.01)
*H10K 30/82* (2023.01)
*H10K 30/87* (2023.01)
*H10K 39/32* (2023.01)
*H10K 71/60* (2023.01)

(52) U.S. Cl.
CPC ....... *H10K 30/88* (2023.02); *H01L 27/14621* (2013.01); *H10K 30/20* (2023.02); *H10K 30/82* (2023.02); *H10K 30/87* (2023.02); *H10K 39/32* (2023.02); *H10K 71/60* (2023.02)

(58) Field of Classification Search
CPC ............ H01L 27/307; H01L 27/14643; H01L 27/14645; H01L 27/14649; H01L 27/14665; H01L 27/14667; H01L 27/14669; H01L 51/424; H01L 51/4253; H10K 39/32; H10K 30/20; H10K 30/30; H10K 30/353
See application file for complete search history.

(56) References Cited

U.S. PATENT DOCUMENTS

| | | | |
|---|---|---|---|
| 7,629,216 B2 | 12/2009 | Cha | |
| 8,460,993 B2 | 6/2013 | Cha | |
| 2014/0042411 A1* | 2/2014 | Fukuzaki | H10K 85/6572 548/440 |
| 2016/0214942 A1* | 7/2016 | Parham | C07D 405/04 |
| 2020/0099003 A1* | 3/2020 | Ujiie | H10K 85/636 |

FOREIGN PATENT DOCUMENTS

| | | |
|---|---|---|
| JP | H05-082826 A | 4/1993 |
| KR | 100258974 B1 | 6/2000 |
| KR | 100772316 B1 | 10/2007 |
| KR | 2014-0018702 A | 2/2014 |

* cited by examiner

*Primary Examiner* — Jesse Y Miyoshi
(74) *Attorney, Agent, or Firm* — Harness, Dickey & Pierce, P.L.C.

(57) ABSTRACT

An organic sensor includes a first electrode, a second electrode, an organic active layer between the first electrode and the second electrode, and a protective layer between the organic active layer and the second electrode. Capacitance provided of the first electrode, the protective layer, and the second electrode is less than or equal to about $2 \times 10^{-10}$ F.

19 Claims, 14 Drawing Sheets

ORGANIC SENSORS AND ELECTRONIC DEVICES

CROSS-REFERENCE TO RELATED APPLICATION

This application claims priority to and the benefit of Korean Patent Application No. 10-2019-0070954 filed in the Korean Intellectual Property Office on Jun. 14, 2019, the entire contents of which are incorporated herein by reference.

BACKGROUND

1. Field

Organic sensors and electronic devices are disclosed.

2. Description of the Related Art

Organic sensors may be configured to have higher resolutions, resulting in smaller pixel sizes of said organic sensors. In the case of a silicon photodiode which is mainly used now, sensitivity may be deteriorated because sizes of the pixel become smaller and the absorption areas are reduced. Accordingly, an organic material that is capable of replacing silicon has been researched.

An organic material has a high extinction coefficient and selectively absorbs light in a particular wavelength region depending on a molecular structure, and thus may simultaneously replace a photodiode and a color filter and resultantly improve sensitivity and contribute to high integration. However, organic materials are prone to degradation in subsequent processes and may degrade performance of organic sensors.

SUMMARY

Some example embodiments provide an organic sensor capable of reducing or preventing performance degradation.

Some example embodiments provide an electronic device including the organic sensor.

According to some example embodiments, an organic sensor may include a first electrode, a second electrode, an organic active layer between the first electrode and the second electrode, and a protective layer between the organic active layer and the second electrode. A capacitance of the first electrode, the protective layer, and the second electrode may be less than or equal to about $2 \times 10^{-10}$ F.

A thickness of the protective layer may be not uniform.

A greatest thickness of the protective layer may be less than or equal to about 5 nm.

The protective layer may include at least one hole extending fully through a thickness of the protective layer between opposite surfaces of the protective layer.

A portion of the organic active layer may be in contact with the second electrode.

The protective layer may include an organic material, a carbon-containing material, or a combination thereof.

The organic material may be a substance including molecules having a molecular weight ranging from about 50 Da to about 5,000 Da.

The protective layer may include a light absorbing organic material, a light absorbing carbon-containing material, or a combination thereof.

The second electrode may be a sputtered electrode.

The second electrode may be a sputtered conductive oxide electrode.

The capacitance of the first electrode, the protective layer, and the second electrode may be about $1 \times 10^{-13}$ F to about $2 \times 10^{-10}$ F.

The organic active layer may be a photoelectric conversion layer that is configured to absorb light in at least a portion of a wavelength region and convert the absorbed light into an electric signal.

The organic sensor may further include a semiconductor substrate on the first electrode such that the first electrode is between the semiconductor substrate and the organic active layer.

The semiconductor substrate may further include a charge storage electrically connected to the first electrode.

According to some example embodiments, a method of manufacturing an organic sensor may include forming a first electrode, forming an organic active layer on the first electrode, forming a protective layer on the organic active layer, and forming a second electrode on the protective layer by sputtering. A capacitance of the first electrode, the protective layer, and the second electrode may be less than or equal to about $2 \times 10^{-10}$ F.

The protective layer may be formed with a thickness of about 1 nm to 6 nm.

The forming of the protective layer may include thermal deposition of an organic material, a carbon-containing material, or a combination thereof on the organic active layer.

An electronic device may include the organic sensor.

According to some example embodiments, an organic sensor may include a semiconductor substrate, and a plurality of sensors on the semiconductor substrate. Each separate sensor of the plurality of sensors may include a first electrode, a second electrode, an organic active layer between the first electrode and the second electrode, and a protective layer between the organic active layer and the second electrode. A capacitance of the first electrode, the protective layer, and the second electrode may be less than or equal to about $2 \times 10^{-10}$ F.

Each separate sensor of the plurality of sensors may be configured to absorb and convert a different wavelength region of incident light into electric signals.

The plurality of sensors may be stacked vertically on the semiconductor substrate, such that the plurality of organic sensors overlap each other in a direction extending perpendicular to a top surface of the semiconductor substrate.

The plurality of sensors may be arranged horizontally on the semiconductor substrate, such that the plurality of sensors overlap each other in a direction extending parallel to a top surface of the semiconductor substrate.

An electronic device may include the organic sensor.

DETAILED DESCRIPTION

Figure 1:
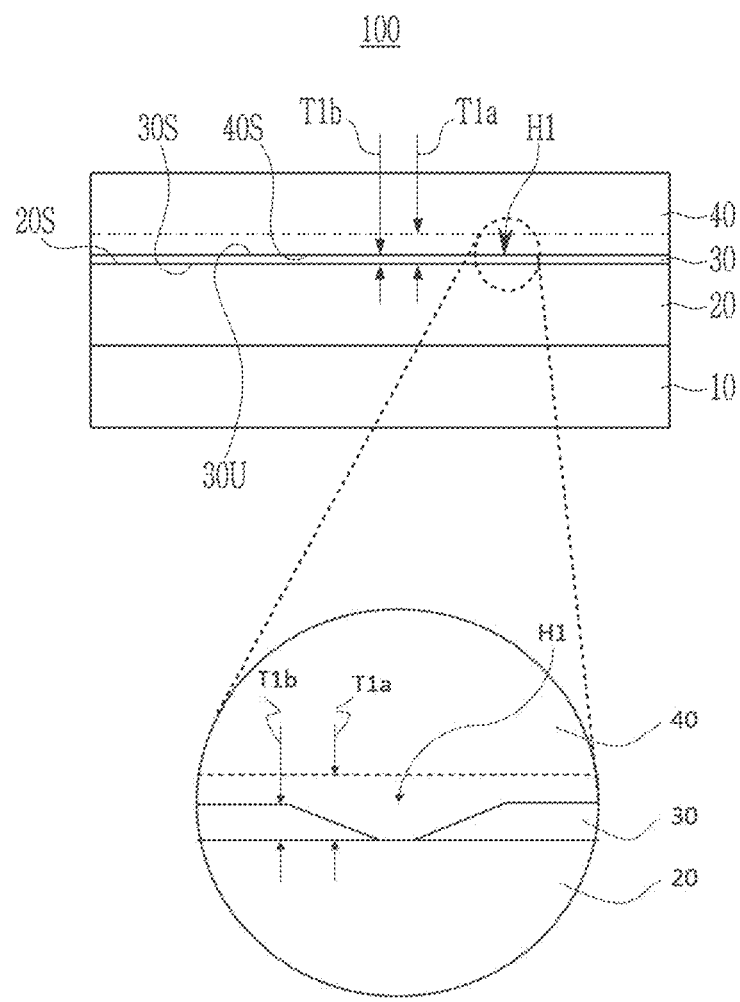
FIG. 1 is a cross-sectional view showing an example of an organic sensor according to some example embodiments.

Hereinafter, example embodiments of the present disclosure will be described in detail so that a person skilled in the art would understand the same. However, this disclosure may be embodied in many different forms and is not to be construed as limited to the example embodiments set forth herein.

In the drawings, the thickness of layers, films, panels, regions, etc., are exaggerated for clarity.

It will be understood that when an element such as a layer, film, region, or substrate is referred to as being "on" another element, it may be directly on the other element or intervening elements may also be present. In contrast, when an element is referred to as being "directly on" another element, there are no intervening elements present.

As used herein, when a definition is not otherwise provided, "substituted" refers to replacement of a hydrogen atom of a compound by a substituent selected from a halogen atom, a hydroxy group, an alkoxy group, a nitro group, a cyano group, an amino group, an azido group, an amidino group, a hydrazino group, a hydrazono group, a carbonyl group, a carbamyl group, a thiol group, an ester group, a carboxyl group or a salt thereof, a sulfonic acid group or a salt thereof, phosphoric acid or a salt thereof, silyl group, a C1 to C20 alkyl group, a C2 to C20 alkenyl group, a C2 to C20 alkynyl group, a C6 to C30 aryl group, a C7 to C30 arylalkyl group, a C1 to C30 alkoxy group, a C1 to C20 heteroalkyl group, a C3 to C20 heteroaryl group, a C3 to C20 heteroarylalkyl group, a C3 to C30 cycloalkyl group, a C3 to C15 cycloalkenyl group, a C6 to C15 cycloalkynyl group, a C3 to C30 heterocycloalkyl group, and a combination thereof.

As used herein, when a definition is not otherwise provided, "hetero" refers to one including 1 to 4 heteroatoms selected from N, O, S, Se, Te, Si, and P.

Hereinafter, "combination" may refer to a mixture of two or more and a stack structure of two or more.

Hereinafter, an organic sensor according to some example embodiments is described.

Figure 8:
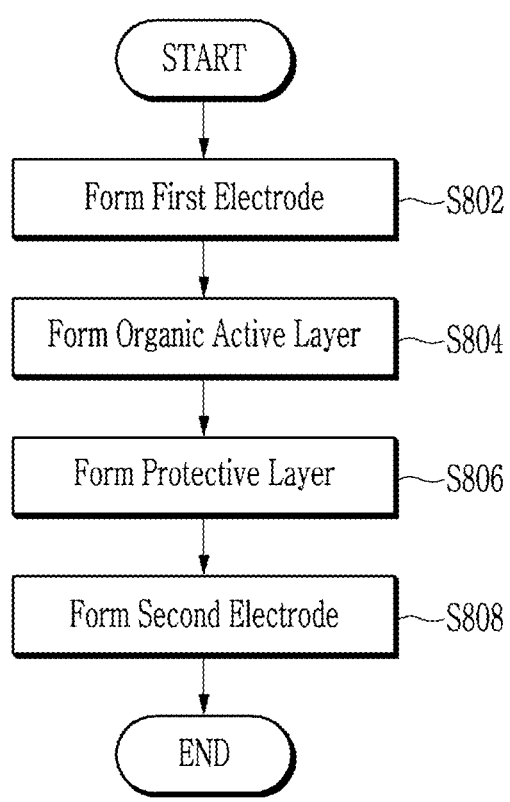
FIG. 8 is a flowchart showing an example method of manufacturing an organic sensor according to some example embodiments.

FIG. 1 is a cross-sectional view showing an example of an organic sensor according to some example embodiments. FIG. 8 is a flowchart showing an example method of manufacturing an organic sensor according to some example embodiments. As described herein, an organic sensor may be an organic CMOS image sensor. It will be understood that the method shown under FIG. 8 may be implemented by well-known mechanisms for forming one or more layers of one or more semiconductor devices, including one or more layers of one or more organic sensors, including one or more layers of one or more organic CMOS image sensor (OCIS) devices, and such mechanisms may be controlled by a computing device (e.g., a processor executing a program of instructions stored in a memory) to cause the mechanisms to perform some or all of the method shown in FIG. 8. Such computing device may include one or more instances of processing circuitry such as hardware including logic circuits; a hardware/software combination such as a processor executing software; or a combination thereof. For example, the processing circuitry more specifically may include, but is not limited to, a central processing unit (CPU), an arithmetic logic unit (ALU), a digital signal processor, a microcomputer, a field programmable gate array (FPGA), a System-on-Chip (SoC), a programmable logic unit, a microprocessor, application-specific integrated circuit (ASIC), etc. In some example embodiments, the processing circuitry may include a non-transitory computer readable storage device, for example a solid state drive (SSD), storing a program of instructions, and a processor configured to execute the program of instructions to control one or more well-known mechanisms for forming one or more layers of one or more semiconductor devices, including one or more layers of one or more organic sensors, including one or more layers of one or more organic CMOS image sensor (OCIS) devices to implement the some or all of the method of FIG. 8.

Referring to FIG. 1, an organic sensor 100 according to some example embodiments includes a first electrode 10, an organic active layer 20, a protective layer 30, and a second electrode 40. As shown in FIG. 1, the organic active layer 20 may be between the first electrode 10 and the second electrode 40. As shown in FIG. 1, the protective layer 30 may be between the organic active layer 20 and the second electrode 40. As further shown in FIG. 1, the organic active layer 20 may be in direct contact with the first electrode 10, and the protective layer 30 may be directly between (e.g., may directly contact each of) the organic active layer 20 and the second electrode 40.

A substrate (not shown), e.g., a semiconductor substrate, may be disposed under the first electrode 10 or above the second electrode 40. For example, the substrate may be on the first electrode 10 such that the first electrode 10 is between the substrate and the organic active layer 20. In another example, the substrate may be on the second electrode 40 such that the second electrode 40 is between the substrate and the organic active layer 20. The substrate may be for example made of (e.g., may at least partially include) an inorganic material such as glass, an organic material such as polycarbonate, polymethylmethacrylate, polyethyleneterephthalate, polyethylenenaphthalate, polyamide, polyethersulfone, or a combination thereof, or a silicon wafer. The substrate may be omitted.

The first electrode 10 may be an anode or a cathode. The first electrode 10 may be for example a transparent electrode or non-transparent electrode. The transparent electrode may include for example at least one of a conductive oxide or a carbon conductor. The conductive oxide may be for example at least one of indium tin oxide (ITO), indium zinc oxide (IZO), zinc tin oxide (ZTO), aluminum tin oxide (AITO), or aluminum zinc oxide (AZO), and the carbon conductor may be at least one of graphene or a carbon nanostructure. The non-transparent electrode may include a reflective conductor such as a metal, for example aluminum (Al), silver (Ag), gold (Au), or an alloy thereof. Referring to FIG. 8, a method of manufacturing an organic sensor 100 (e.g., the organic sensor 100 shown in FIG. 1) may include forming the first electrode 10 (S802). The forming of the first electrode 10 may include forming the first electrode 10 on a substrate. The forming may include sputtering a first electrode material on a substrate material to form the first electrode 10.

The organic active layer 20 may be disposed on the first electrode 10 and may be, for example a photoelectric conversion layer configured to absorb light in at least a portion of a wavelength region (e.g., wavelength spectrum of the light) and convert it (e.g., the absorbed light) into an electric signal. The organic active layer 20 may for example convert at least a portion of light in a green wavelength region (hereinafter, referred to as "green light"), light in a blue wavelength region (hereinafter, referred to as "blue light"), light in a red wavelength region (hereinafter, referred to as "red light"), light in an infrared wavelength region (hereinafter, referred to as "infrared light"), light in an ultraviolet wavelength region (hereinafter, referred to as "ultraviolet light"), or any combination thereof, or the like, into an electric signal.

For example, the organic active layer 20 may be configured to selectively absorb at least one of the green light, the blue light, the red light, the infrared light, or the ultraviolet light. Herein, the selective absorption of at least one from the green light, the blue light, the red light, the infrared light, or the ultraviolet light means that a light-absorption spectrum has a peak absorption wavelength (λmax) in one of about 500 nm to about 600 nm, greater than or equal to about 380 nm and less than about 500 nm, greater than about 600 nm and less than or equal to about 700 nm, and greater than about 700 nm and less than or equal to about 1200 nm and a light-absorption spectrum in the corresponding wavelength region is remarkably higher than those in the other wavelength regions.

When the terms "about" or "substantially" are used in this specification in connection with a numerical value, it is intended that the associated numerical value include a tolerance of ±10% around the stated numerical value. When ranges are specified, the range includes all values therebetween such as increments of 0.1%.

The organic active layer 20 may include at least one p-type semiconductor and at least one n-type semiconductor which form a pn junction and may produce excitons by receiving light from outside and then separate the produced excitons into holes and electrons.

The p-type semiconductor and the n-type semiconductor may be independently light-absorbing materials, and for example at least one of the p-type semiconductor or the n-type semiconductor may be an organic light-absorbing material. For example, at least one of the p-type semiconductor or the n-type semiconductor may be a wavelength-selective light-absorbing material that selectively absorbs light in a particular (or, alternatively, predetermined) wavelength region, and for example at least one of the p-type semiconductor or the n-type semiconductor may be a wavelength-selective organic light-absorbing material. The p-type semiconductor and the n-type semiconductor may have a peak absorption wavelength ($\lambda_{max}$) in the same wavelength region or in a different wavelength region, among a green wavelength region, a blue wavelength region, a red wavelength region, and an infrared wavelength region.

For example, the p-type semiconductor may be an organic material having a core structure including an electron donating moiety, a pi conjugation linking group, and an electron accepting moiety.

The p-type semiconductor may be for example represented by Chemical Formula 1, but is not limited thereto.

EDG-HA-EAG [Chemical Formula 1]

In Chemical Formula 1,
HA may be a C2 to C30 heterocyclic group having at least one of S, Se, Te, or Si,
EDG may be an electron-donating group, and
EAG may be an electron accepting group.

For example, the p-type semiconductor represented by Chemical Formula 1 may be for example represented by Chemical Formula 1A.

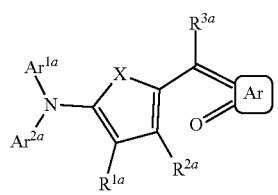

[Chemical Formula 1A]

In Chemical Formula 1A,
X may be S, Se, Te, SO$_2$, SO$_2$, or SiR$^a$R$^b$,
Ar may be a substituted or unsubstituted C6 to C30 arylene group, a substituted or unsubstituted C3 to C30 heterocyclic group, or a fused ring of the foregoing two or more,
Ar$^{1a}$ and Ar$^{2a}$ may independently be a substituted or unsubstituted C6 to C30 aryl group or a substituted or unsubstituted C3 to C30 heteroaryl group,
Ar$^{1a}$ and Ar$^{2a}$ may independently be present alone or may be linked with each other to form a fused ring, and
R$^{1a}$ to R$^{3a}$, R$^a$, and R$^b$ may independently be hydrogen, deuterium, a substituted or unsubstituted C1 to C30 alkyl group, a substituted or unsubstituted C6 to C30 aryl group, a substituted or unsubstituted C3 to C30 heteroaryl group, a substituted or unsubstituted C1 to C6 alkoxy group, a halogen, or a cyano group.

For example, in Chemical Formula 1A, Ar$^{1a}$ and Ar$^{2a}$ may independently be one of a substituted or unsubstituted phenyl group, a substituted or unsubstituted naphthyl group, a substituted or unsubstituted anthracenyl group, a substituted or unsubstituted phenanthrenyl group, a substituted or unsubstituted pyridinyl group, a substituted or unsubstituted pyridazinyl group, a substituted or unsubstituted pyrimidinyl group, a substituted or unsubstituted pyrazinyl group, a substituted or unsubstituted quinolinyl group, a substituted or unsubstituted isoquinolinyl group, a substituted or unsubstituted naphthyridinyl group, a substituted or unsubstituted cinnolinyl group, a substituted or unsubstituted quinazolinyl group, a substituted or unsubstituted phthalazinyl group, a substituted or unsubstituted benzotriazinyl group, a substituted or unsubstituted pyridopyrazinyl group, a substituted or unsubstituted pyridopyrimidinyl group, and a substituted or unsubstituted pyridopyridazinyl group.

For example, Ar$^{1a}$ and Ar$^{2a}$ of Chemical Formula 1A may be linked with each other to form a ring or for example, Ar$^{1a}$ and Ar$^{2a}$ may be linked with each other by one of a single bond, —(CR$^g$R$^h$)$_{n2}$— (n2 is 1 or 2), —O—, —S—, —Se—, —N═, —NR$^i$—, —SiR$^j$R$^k$—, and —GeR$^l$R$^m$— to form a ring. Herein, R$^g$ to R$^m$ may independently be hydrogen, a substituted or unsubstituted C1 to C30 alkyl group, a substituted or unsubstituted C6 to C30 aryl group, a substituted or unsubstituted C3 to C30 heteroaryl group, a substituted or unsubstituted C1 to C6 alkoxy group, a halogen, or a cyano group.

For example, the p-type semiconductor represented by Chemical Formula 1 may be for example represented by Chemical Formula 1B.

[Chemical Formula 1B]

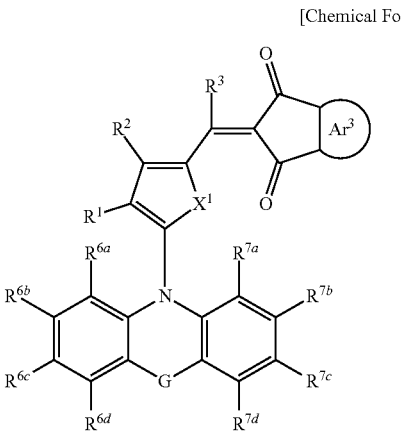

In Chemical Formula 1B, $X^1$ may be Se, Te, O, S, SO, or $SO_2$, $Ar^3$ may be a substituted or unsubstituted C6 to C30 arylene group, a substituted or unsubstituted C3 to C30 heterocyclic group, or a fused ring of the foregoing two or more, $R^1$ to $R^3$ may independently be one of hydrogen, deuterium, a substituted or unsubstituted C1 to C30 alkyl group, a substituted or unsubstituted C1 to C30 alkoxy group, a substituted or unsubstituted C6 to C30 aryl group, a substituted or unsubstituted C3 to C30 heteroaryl group, a halogen, a cyano group, a cyano-containing group, and a combination thereof, G may be one of a single bond, —O—, —S—, —Se—, —N═, —(CR$^f$R$^g$)$_k$—, —NR$^h$—, —SiR$^i$R$^j$—, —GeR$^k$R$^l$—, —(C(R$^m$)═C(R$^n$))—, and SnR$^o$R$^p$, wherein R$^f$, R$^g$, R$^h$, R$^i$, R$^j$, R$^k$, R$^l$, R$^m$, R$^n$, R$^o$, and R$^p$ may independently be one of hydrogen, a halogen, a substituted or unsubstituted C1 to 010 alkyl group, a substituted or unsubstituted C1 to C10 alkoxy group, and a substituted or unsubstituted C6 to C12 aryl group, R$^f$ and R$^g$, R$^i$ and R$^j$, R$^k$ and R$^l$, R$^m$ and R$^n$, and R$^o$ and R$^p$ may independently be present alone or may be linked with each other to provide a ring, and k may be 1 or 2, $R^{6a}$ to $R^{6d}$ and $R^{7a}$ to $R^{7d}$ may independently be one of hydrogen, a substituted or unsubstituted C1 to C30 alkyl group, a substituted or unsubstituted C6 to C30 aryl group, a substituted or unsubstituted C3 to C30 heteroaryl group, a halogen, a cyano group, a cyano-containing group, and a combination thereof, $R^{6a}$ to $R^{6d}$ may independently be present alone or adjacent two thereof may be linked with each other to form a fused ring, and $R^{7a}$ to $R^{7d}$ may independently be present alone or adjacent two thereof may be linked with each other to form a fused ring.

For example, $Ar^3$ of Chemical Formula 1B may be benzene, naphthylene, anthracene, thiophene, selenophene, tellurophene, pyridine, pyrimidine, or a fused ring of the foregoing two or more.

The n-type semiconductor may be for example fullerene or a fullerene derivative, but is not limited thereto.

The organic active layer 20 may be an intrinsic layer (an I layer) wherein the p-type semiconductor and the n-type semiconductor are blended as a bulk heterojunction. Herein, the p-type semiconductor and the n-type semiconductor may be blended in a volume ratio of about 1:9 to about 9:1, for example about 2:8 to about 8:2, about 3:7 to about 7:3, about 4:6 to about 6:4, or about 5:5.

The organic active layer 20 may include a bi-layer including a p-type layer including the aforementioned p-type semiconductor and an n-type layer including the aforementioned n-type semiconductor. Herein, a thickness ratio of the p-type layer and the n-type layer may be about 1:9 to about 9:1, for example about 2:8 to about 8:2, about 3:7 to about 7:3, about 4:6 to about 6:4, or about 5:5.

The organic active layer 20 may further include a p-type layer and/or an n-type layer in addition to the intrinsic layer. The p-type layer may include the aforementioned p-type semiconductor and the n-type layer may include the aforementioned n-type semiconductor. For example, they may be included in various combinations of p-type layer/I layer, I layer/n-type layer, p-type layer/I layer/n-type layer, and the like.

Referring to FIG. 8, a method of manufacturing an organic sensor 100 (e.g., the organic sensor 100 shown in FIG. 1) may include forming the organic active layer 20 on the first electrode 10 (S804). The forming of organic active layer 20 may include forming the applying any of the aforementioned materials that may at least partially comprise the organic active layer 20 on the first electrode 10. Such materials may be applied on the first electrode 10 according to any known method.

The protective layer 30 is a layer for protecting the organic active layer 20, and is disposed on the organic active layer 20. Referring to FIG. 8, a method of manufacturing an organic sensor 100 (e.g., the organic sensor 100 shown in FIG. 1) may include forming the protective layer 30 on the organic active layer 20 (S806). The protective layer 30 may cover a whole surface of the organic active layer 20 or, alternatively, a limited portion of a surface of the organic active layer 20. The protective layer 30 is for example in contact (e.g., direct contact) with the organic active layer 20, for example, one surface 30S of the protective layer 30 may be in contact with a surface 20S of the organic active layer 20, while the other surface 30U of the protective layer 30 may be in contact (e.g., direct contact) with a surface 40S of the second electrode 40.

The protective layer 30 may block plasma from directly contacting the organic active layer 20 in a subsequent process, for example, a process of sputtering a conductor for a second electrode to form the second electrode 40 (S808). Accordingly, the protective layer 30 may reduce or prevent a damage of the organic active layer 20 by the plasma, for example may reduce or prevent damage of the organic active layer 20 by a plasma used during forming the second electrode 40 (S808).

The protective layer 30 may be formed, at S806) with a thickness T1a of less than or equal to about 6 nm, for example a thickness (e.g., thickness in a direction that is perpendicular to the surface 20S of the organic active layer 20) of about 1 nm to about 6 nm, but a portion of the protective layer 30 may be removed by plasma so that the thickness of the actual (e.g., final) protective layer 30 of the completed organic sensor 100 may have a thinner final thickness T1b than the original formation thickness T1a.

For example, the forming of the second electrode 40 at S808 may include removing a portion of the surfaces of the protective layer 30, and thus the thickness T1b of the protective layer 30 upon completion of S808 may not be uniform. For example, the protective layer 30 may be relatively thin or completely removed and thus have a hole where much removed by the plasma, while the protective layer 30 may have a thickness T1b near to an original thickness T1a where little removed by the plasma. For example, the protective layer 30 may have a maximum (e.g., greatest) thickness T1b of less than or equal to about 5 nm, for example, about 1 nm to about 5 nm, about 1 nm to about 4 nm, about 1 nm to about 3 nm, or about 1 nm to about 2 nm. For example, the protective layer 30 may have at least one hole H1 extending partially or fully through the thickness T1b of the protective layer 30, between opposite surfaces 30S and 30U, to expose at least a portion of the organic active layer 20, and accordingly, a portion of the organic active layer 20 may be in contact (e.g., direct contact) with the second electrode 40 via said hole H1 which is described later. For example, a portion of the second electrode 40 may extend partially to fully through said hole H1 to directly contact at least surface 20S of the organic active layer 20.

The protective layer 30 may be for example formed, at S806, of (e.g., may be formed to at least partially include) a thermally depositable material, for example, an organic material, a carbon-containing material, or a combination thereof. The organic material may be for example a small molecule, for example, a substance comprised of molecules having a molecular weight ranging from about 50 (Dalton (Da) or g/mol) to about 5,000 (Da or g/mol). Accordingly, the forming of the protective layer at S806 may include thermal deposition of an organic material, a carbon-containing material, or a combination thereof on the organic active layer 20.

The protective layer 30 may include for example a light absorbing material, for example, a light absorbing organic material, a light absorbing carbon-containing material, or a combination thereof, which may be configured to absorb at least one of green light, blue light, red light, infrared light, or ultraviolet light. The light absorbing organic material may be for example a small molecule including at least one heterocycle, and the carbon-containing material may be for example fullerene or a fullerene derivative. In some example embodiments, the protective layer 30 includes a thermally depositable light absorbing material including molecules having a molecular weight ranging from about 50 Da to about 5,000 Da.

For example, in addition to or instead of a capacitance of the first electrode, the protective layer, and the second electrode being less than or equal to about 2×10⁻¹⁰ F, the protective layer 30 may include an organic material represented by any of Chemical Formulae 2A to 2C, but is not limited thereto.

[Chemical Formula 2A]

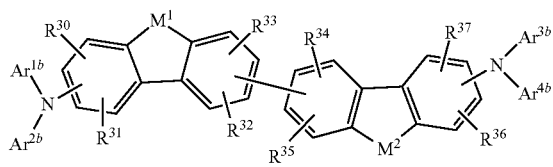

[Chemical Formula 2B]

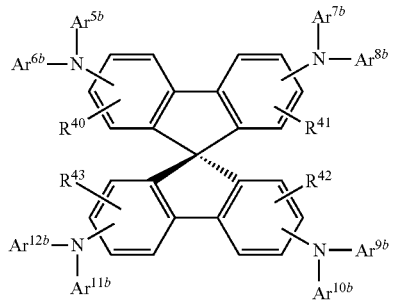

[Chemical Formula 2C]

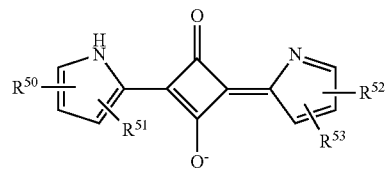

In Chemical Formulae 2A to 2C,
M$^1$ and M$^2$ are each independently CR"R$^o$, SiR$^p$R$^q$, NR$^r$, O, S, Se, or Te,
Ar$^{1b}$ to Ar$^{12b}$ are each independently a substituted or unsubstituted C6 to C30 aryl group, or a substituted or unsubstituted C3 to C30 heteroaryl group,
Ar$^{1b}$ and Ar$^{2b}$, Ar$^{3b}$ and Ar$^{4b}$, Ar$^{5b}$ and Ar$^{6b}$, Ar$^{7b}$ and Ar$^{8b}$, Ar$^{9b}$ and Ar$^{10b}$, or Ar$^{11b}$ and Ar$^{12b}$ are each independently present or linked with each to form a ring,
R$^{30}$ to R$^{37}$, R$^{40}$ to R$^{43}$, R$^{50}$ to R$^{53}$, and R" to R$^r$ are each independently hydrogen, a substituted or unsubstituted C1 to C30 alkyl group, a substituted or unsubstituted C6 to C30 aryl group, a substituted or unsubstituted C3 to C30 heterocyclic group, a substituted or unsubstituted C1 to C6 alkoxy group, a halogen, or a cyano group.

The second electrode 40 is disposed on the protective layer 30. The second electrode 40 may be a light-receiving electrode or may be a transparent electrode.

The second electrode 40 may be a sputtered electrode formed by sputtering, or may be a sputtered conductive oxide electrode formed by sputtering a conductive oxide. The second electrode 40 may be for example at least one of indium tin oxide (ITO), indium zinc oxide (IZO), zinc tin oxide (ZTO), aluminum tin oxide (AITO), or aluminum zinc oxide (AZO), but is not limited thereto.

The second electrode 40 may be a cathode or an anode.

As described above, the protective layer 30 may reduce or prevent the organic active layer 20 from being damaged by the plasma by blocking the plasma exposed in the forming of the second electrode 40 at S808. Accordingly degradation of the organic active layer 20 as a result of the forming at S808 may be reduced or prevented and thus performance of the organic sensor 100 may be reduced or prevented from being deteriorated. The forming of the second electrode 40 at S808 may be performed via the same or similar methods used to form the first electrode 10 at S802 (e.g., S802 may include forming the first electrode 10 by sputtering, and S808 may include forming the second electrode 40 by sputtering).

In some example embodiments, the protective layer 30 is disposed between the organic active layer 20 and the second electrode 40 and may be a path transferring charges generated from the organic active layer 20 to the second electrode 40. Accordingly, the protective layer 30 may play a role of protecting the aforementioned organic active layer 20 and would better have very thin thickness as not to hinder the charge transfer.

When the protective layer 30 has characteristics of being configured to reduce charge mobility between the organic active layer 20 and the second electrode 40, for example, particular (or, alternatively, predetermined) insulation properties, the first electrode 10, the protective layer 30, and the second electrode 40 may form a capacitor and thus have (e.g., may be associated with) a particular (or, alternatively, predetermined) capacitance. As the capacitance of the first electrode 10, protective layer 30, and second electrode 40 (understood herein to be the collective capacitance of the first electrode 10, protective layer 30, and second electrode 40) is higher (e.g., greater), the insulating characteristics of the protective layer 30 may be higher (e.g., greater), but as the capacitance is lower (e.g., smaller), the insulating characteristics of the protective layer 30 may be lower (e.g., smaller). Restated, the capacitance of the protective layer 30 may be proportional (e.g., directly proportional) to insulative characteristics (e.g., thermal resistance, R-value, inverse of thermal conductivity, specific heat capacity, etc.) of the protective layer 30.

For example, the capacitance provided by the first electrode 10, the protective layer 30, and the second electrode 40 may be very low, and may be less than or equal to about $2\times10^{-10}$ farads (F). Within the range, the capacitance provided by the first electrode 10, the protective layer 30, and the second electrode 40 may be about $1\times10^{-15}$ F to about $2\times10^{-10}$ F., about $1\times10^{-14}$ F to about $2\times10^{-10}$ F., about $1\times10^{-13}$ F to about $2\times10^{-10}$ F., about $1\times10^{-13}$ F to about $1.5\times10^{-10}$ F, or about $1\times10^{-13}$ F to about $1.2\times10^{-10}$ F.

The organic sensor 100 may further include an anti-reflection layer (not shown) on the second electrode 40. The anti-reflection layer may be disposed at a light incidence side and lower reflectance of light of incident light and thereby light absorbance may be further improved.

The anti-reflection layer may include, for example a material having a refractive index of about 1.6 to about 2.5, and may include for example at least one of metal oxide, metal sulfide, or an organic material having a refractive index within the ranges. The anti-reflection layer may include, for example a metal oxide such as aluminum-containing oxide, molybdenum-containing oxide, tungsten-containing oxide, vanadium-containing oxide, rhenium-containing oxide, niobium-containing oxide, tantalum-containing oxide, titanium-containing oxide, nickel-containing oxide, copper-containing oxide, cobalt-containing oxide, manganese-containing oxide, chromium-containing oxide, tellurium-containing oxide, or a combination thereof; metal sulfide such as zinc sulfide; or an organic material such as an amine derivative, but is not limited thereto.

When light enters from the second electrode 40 and the organic active layer absorbs light in a particular (or, alternatively, predetermined) wavelength region, excitons may be produced thereinside. The excitons are separated into holes and electrons in the organic active layer 30, and the separated holes are transported to an anode that is one of the first electrode 10 and the second electrode 20, and the separated electrons are transported to the cathode that is the other of the first electrode 10 and the second electrode 20 so as to flow a current.

Hereinafter, an example of a manufacturing method of the aforementioned organic sensor 100 will be described.

For example, the method of manufacturing the organic sensor 100 may include forming a first electrode 10, forming an organic active layer 20 on the first electrode 10, forming a protective layer 30 on the organic active layer 20, and forming a second electrode 40 on the protective layer 30.

The forming of the first electrode 10 may be for example performed by sputtering or thermally depositing, for example, sputtering or thermally depositing a conductive oxide, a carbon conductor, and/or a metal.

The forming of the organic active layer 20 may be for example obtained by codepositing at least one p-type semiconductor and at least one n-type semiconductor.

The forming of the protective layer 30 may be performed by thermally depositing a thermally depositable material, for example, a thermally depositable organic material, a thermally depositable carbon-containing material, or a combination thereof. In this way, the protective layer 30 is formed by the thermal depositing and thus may reduce a damage on the organic active layer 20 disposed thereunder.

The protective layer 30 may have a very thin thickness ranging from about 1 nm to about 6 nm. Since the protective layer 30 has a very thin thickness and thus may block plasma during a subsequent process, thereby, effectively protect the organic active layer 20 and simultaneously, hinder no charge mobility between the organic active layer 20 and the second electrode 40, and resultantly, reduce or prevent performance deterioration of the organic sensor 100.

The second electrode 40 may be formed by sputtering the conductor for the second electrode, for example, conductive oxide, for example, at least one of indium tin oxide (ITO), indium zinc oxide (IZO), zinc tin oxide (ZTO), aluminum tin oxide (AITO), or aluminum zinc oxide (AZO) but is not limited thereto.

Herein, since the conductor for the second electrode is formed on the protective layer 30, the plasma generated during the sputtering is not directly in contact with the organic active layer 30 but blocked by the protective layer 30. In some example embodiments, a part of the protective layer 30 may be removed by the plasma and accordingly, may have a thinner thickness than about 1 nm to about 6 nm of the original formation thickness of the protective layer 30. For example, a final thickness of the protective layer 30 may be less than or equal to about 80%, for example, about 5% to about 80% of the original formation thickness of the protective layer 30.

For example, since a region where the surface of the protective layer 30 is removed by the plasma may not be uniform, the protective layer 30 may have no uniform thickness. For example, a region where the protective layer 30 is much removed may be relatively thin or completely removed and thus forms a hole, but a region where a little removed by the plasma may have a thickness near to the original formation thickness of the protective layer 30. For example, the protective layer 30 may have a maximum thickness of less than or equal to about 5 nm, for example about 1 nm to about 5 nm or about 2 nm to about 4 nm.

Hereinafter, an organic sensor according to some example embodiments is described.

Figure 2:
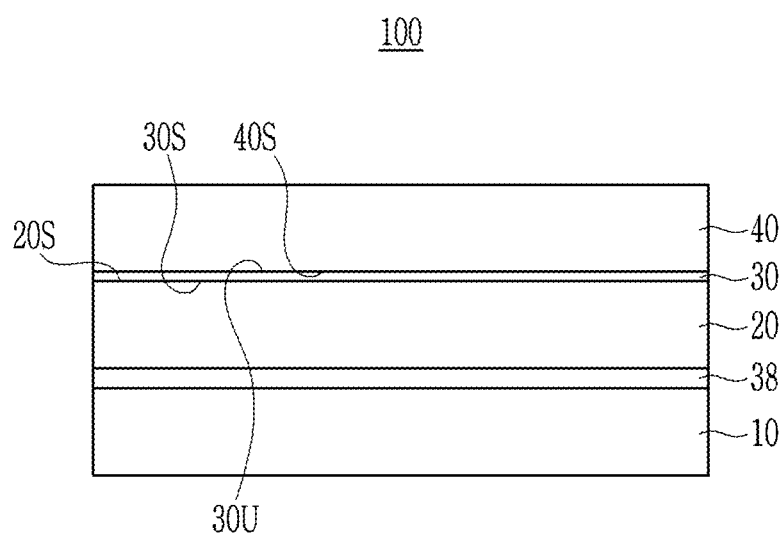
FIG. 2 is a cross-sectional view showing an example of an organic sensor according to some example embodiments.

FIG. 2 is a cross-sectional view showing an example of an organic sensor according to some example embodiments.

Referring to FIG. 2, the organic sensor 100 according to some example embodiments includes a first electrode 10, an organic active layer 20, a protective layer 30, and a second electrode 40 like the example embodiments shown in FIG. 1.

In some example embodiments, the organic sensor 100 further includes a charge auxiliary layer 38 between the first electrode 10 and the organic active layer 20 (e.g., directly between the first electrode 10 and the organic active layer 20, as shown in FIG. 2). The charge auxiliary layer 38 may be a charge transport layer and/or a charge blocking layer. The charge transport layer may be configured to increase mobility of charges between at least the first electrode 10 and the organic active layer 20, and the charge blocking layer may block transfer of charges (e.g., electrons) separated from the organic active layer 20 to the opposite electrode that is on an opposite side of the charge auxiliary layer 38 in relation to at least the organic active layer 20, for example the first electrode 10.

The charge auxiliary layer 38 may include, for example an organic material, an inorganic material, or an organic/inorganic material. The organic material may be an organic compound having hole or electron characteristics and the inorganic material may be, for example metal oxide such as molybdenum oxide, tungsten oxide, or nickel oxide.

The charge auxiliary layer 38 may include for example a visible light non-absorbing material that does not absorb light in a visible region substantially (e.g., does not absorb light in a visible region within manufacturing tolerances and/or material tolerances), for example a visible light non-absorbing organic material.

For example, the visible light non-absorbing material may be a compound represented by Chemical Formula 4A or 4B, but is not limited thereto.

[Chemical Formula 4A]

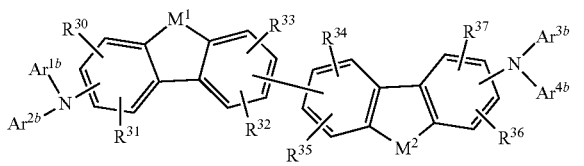

In Chemical Formula 4A, $M^1$ and $M^2$ are each independently $CR''R^o$, $SiR^pR^q$, $NR^r$, O, S, Se, or Te, $Ar^{1b}$, $Ar^{2b}$, $Ar^{3b}$, and $Ar^{4b}$ are each independently a substituted or unsubstituted C6 to C30 aryl group or a substituted or unsubstituted C3 to C30 heteroaryl group, $Ar^{1b}$ and $Ar^{2b}$, or $Ar^{3b}$ and $Ar^{4b}$ are each independently present or linked with each to form a ring, and $R^{30}$ to $R^{37}$ and $R''$ to $R^r$ are each independently hydrogen, a substituted or unsubstituted C1 to C30 alkyl group, a substituted or unsubstituted C6 to C30 aryl group, a substituted or unsubstituted C3 to C30 heterocyclic group, a substituted or unsubstituted C1 to C6 alkoxy group, a halogen, or a cyano group.

For example, the visible light non-absorbing material may be a compound represented by Chemical Formula 4A-1 or 4B-1, but is not limited thereto.

[Chemical Formula 4A-1]

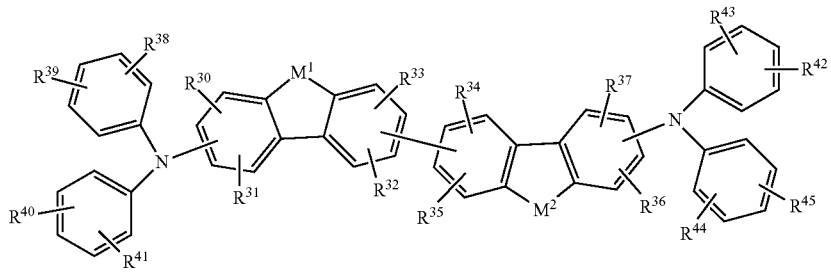

[Chemical Formula 4A-2]

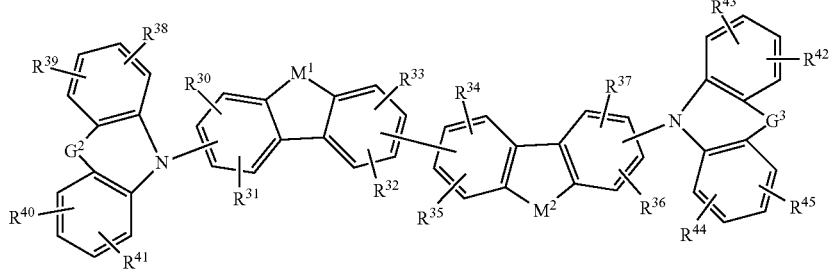

In Chemical Formula 4A-1 or 4B-1, $M^1$, $M^2$, and $R^{30}$ to $R^{37}$ are the same as described above, and, $G^2$ and $G^3$ are each independently a single bond, $-(CR^sR^t)_{n3}-$, $-O-$, $-S-$, $-Se-$, $-N=$, $-NR^u-$, $-SiR^vR^w-$, or $-GeR^xR^y-$, wherein n3 is 1 or 2, and $R^{38}$ to $R^{45}$ and $R^s$ to $R^y$ are each independently hydrogen, a substituted or unsubstituted C1 to C30 alkyl group, a substituted or unsubstituted C6 to C30 aryl group, a substituted or unsubstituted C3 to C30 heteroaryl group, a substituted or unsubstituted C1 to C6 alkoxy group, a halogen, or a cyano group.

For example, the visible light non-absorbing material may be a compound represented by Chemical Formula 4A-1a or 4B-1a, but is not limited thereto.

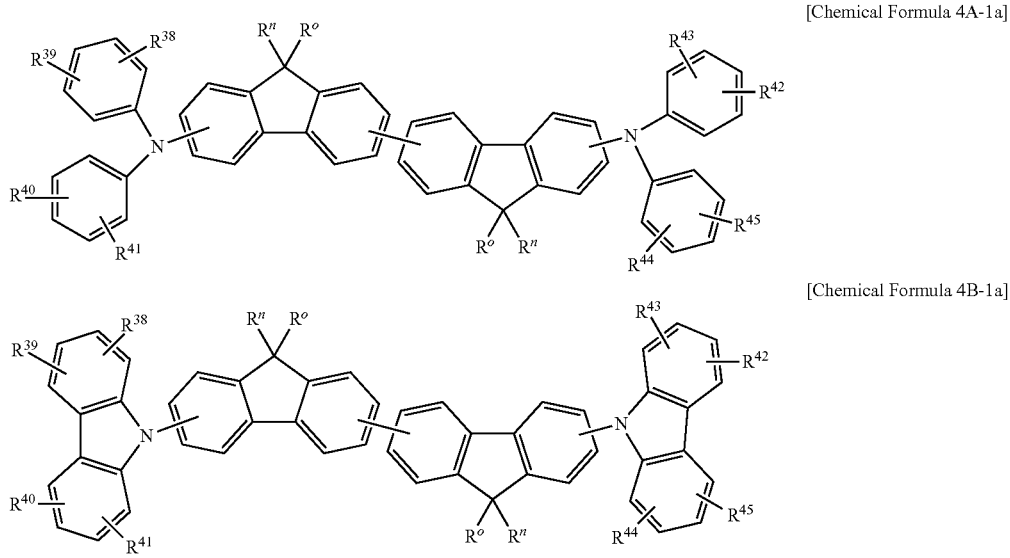

[Chemical Formula 4A-1a]

[Chemical Formula 4B-1a]

In Chemical Formula 4A-1a or 4B-1a, $R^{38}$ to $R^{45}$ and $R^o$ and $R^n$ are the same as described above.

The organic sensor 100 according to some example embodiments further includes a charge auxiliary layer 38 between the first electrode 10 and the organic active layer 20 and thereby holes and electrons separated from the organic active layer 20 may be efficiently transferred to the first electrode 10 or efficiently reduced or prevented from being transferred to the first electrode 10 to further increase charge extraction efficiency.

Hereinafter, an organic sensor according to some example embodiments is described.

Figure 3:
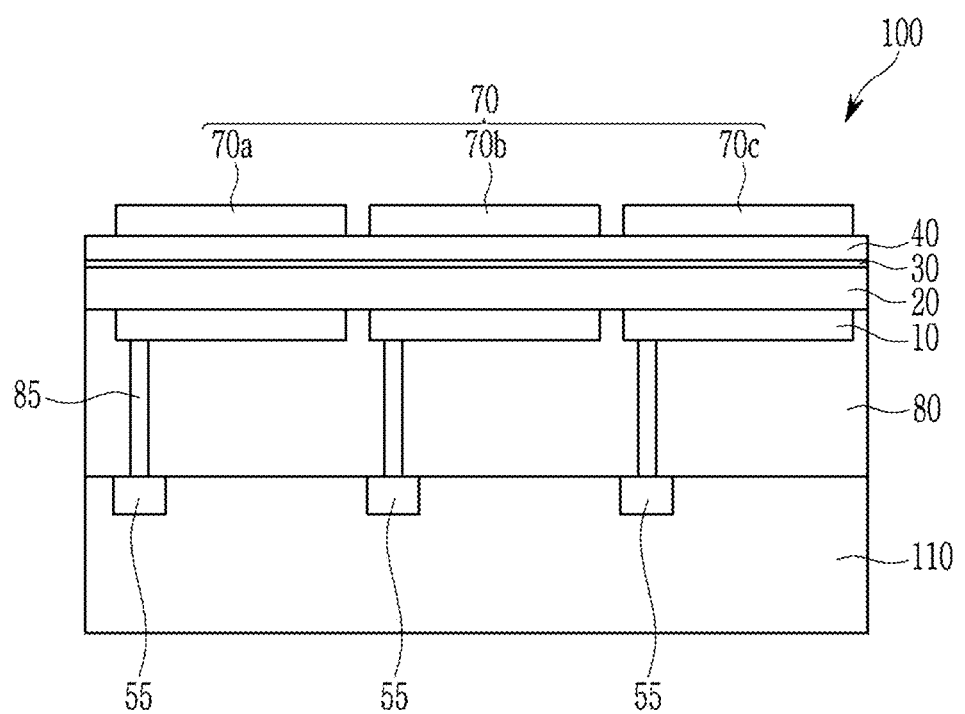
FIG. 3 is a cross-sectional view showing an example of an organic sensor according to some example embodiments.

FIG. 3 is a cross-sectional view showing an example of an organic sensor according to some example embodiments.

The organic sensor according to some example embodiments may be an organic CMOS image sensor.

Referring to FIG. 3, the organic sensor 100 according to some example embodiments includes a first electrode 10, an organic active layer 20, a protective layer 30, and a second electrode 40. The first electrode 10, organic active layer 20, protective layer 30, and second electrode 40 are the same as described above, respectively.

The organic sensor 100 according to some example embodiments further includes a semiconductor substrate 110 and the insulation layer 80 disposed under the first electrode 10 and a color filter layer 70 disposed under or on the first electrode 10. For example, the semiconductor substrate 110 may be on the first electrode 10 such that the first electrode 10 is between the semiconductor substrate 110 and the organic active layer 20. In some example embodiments, the semiconductor substrate 110 may be on the second electrode 40 such that the second electrode 40 is between the semiconductor substrate 110 and the organic active layer 20.

The semiconductor substrate 110 may be a silicon substrate, and is integrated with the transmission transistor (not shown) and the charge storage 55. The charge storage 55 is electrically connected to the first electrode 10. The transfer transistor and/or the charge storage 55 may be integrated for each pixel.

A metal wire (not shown) and a pad (not shown) are formed on the semiconductor substrate 110. In order to decrease signal delay, the metal wire and pad may be made of a metal having low resistivity, for example, aluminum (Al), copper (Cu), silver (Ag), and alloys thereof, but are not limited thereto.

The insulation layer 80 is formed on the metal wire and the pad. The insulation layer 80 may be made of an inorganic insulating material such as a silicon oxide and/or a silicon nitride, or a low dielectric constant (low K) material such as SiC, SiCOH, SiCO, and SiOF. The insulation layer 80 has a trench 85 exposing the charge storage 55. The trench 85 may be filled with fillers.

The color filter layer 70 includes a blue filter 70a formed in a blue pixel, a red filter 70b formed in a red pixel, and a green filter 70c formed in a green pixel. However, the color filter layer 70 may include a cyan filter, a magenta filter, and/or a yellow filter instead of the above filters or may further include them in addition to the above filters. In the drawing, the color filter layer 70 is illustrated on the upper surface of the second electrode 40, but the present inventive concepts are not limited thereto and the color filter layer 70 may be disposed under the second electrode 40. For example, the color filter layer 70 may be disposed between the semiconductor substrate 110 and the first electrode 10. In some example embodiments, the color filter layer 70 may be omitted from the image sensor 100 of FIG. 3.

Focusing lens (not shown) may be further formed on the color filter layer 70. The focusing lens may control a direction of incident light and gather the light in one region. The focusing lens may have a shape of, for example, a cylinder or a hemisphere, but is not limited thereto.

Hereinafter, an organic sensor according to some example embodiments is described.

Figure 4:
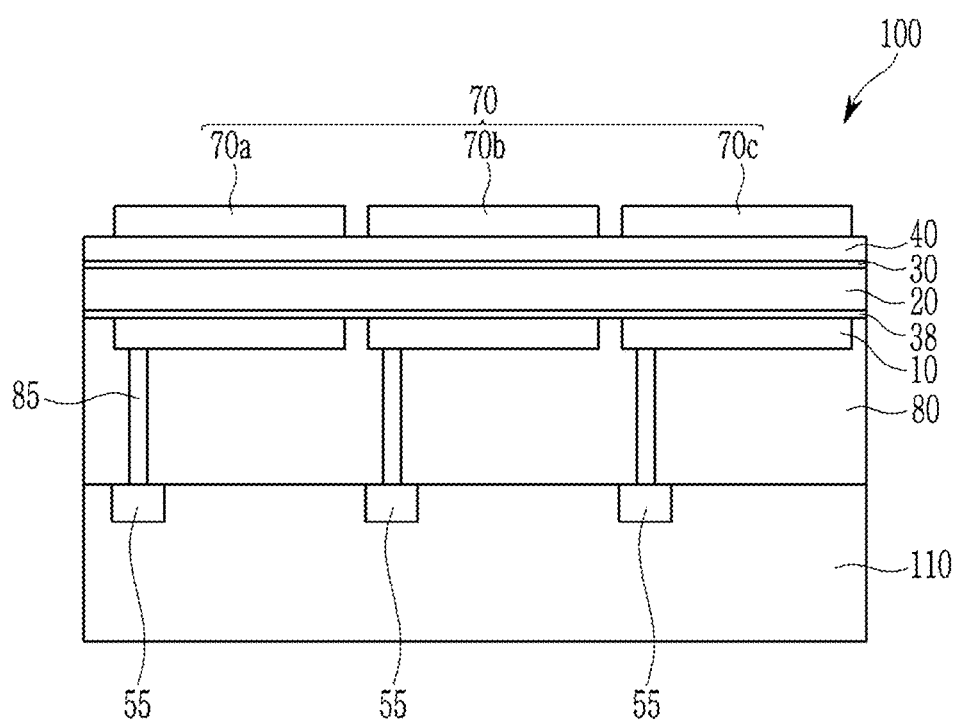
FIG. 4 is a cross-sectional view showing an example of an organic sensor according to some example embodiments.

FIG. 4 is a cross-sectional view showing an example of an organic sensor according to some example embodiments.

Referring to FIG. 4, the organic sensor 100 according to some example embodiments includes a semiconductor substrate 110, an insulation layer 80, a first electrode 10, an organic active layer 20, a protective layer 30, second electrode 40, and a color filter layer 70 like the example embodiments shown in FIG. 3. The semiconductor substrate 110, first electrode 10, organic active layer 20, protective layer 30, second electrode 40, and color filter layer 70 are the same as described above, respectively. In some example embodiments, the color filter layer 70 may be omitted from the image sensor 100 of FIG. 4.

The organic sensor 100 according to some example embodiments further includes a charge auxiliary layer 38 between the first electrode 10 and the organic active layer 20. The charge auxiliary layer 38 may be a charge transport layer and/or a charge blocking layer as described above, and the detailed descriptions thereof are the same as described above.

Hereinafter, an organic sensor according to some example embodiments is described.

Figure 5:
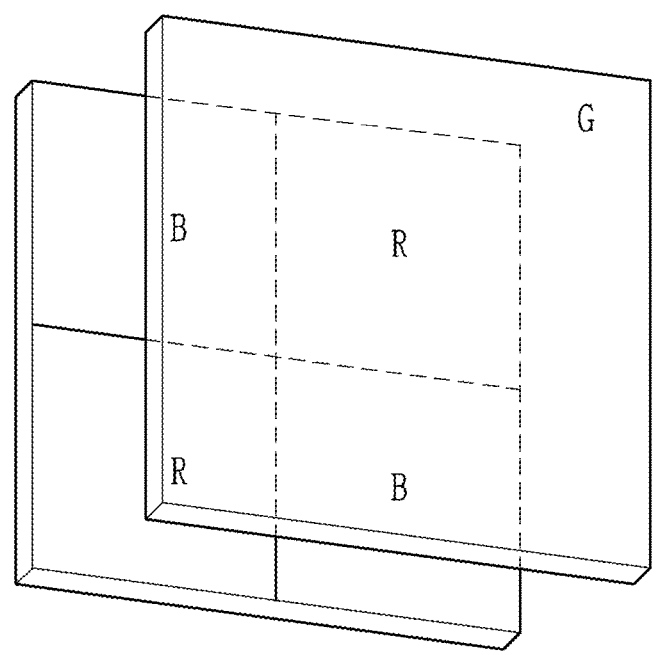
FIG. 5 is a top plan view schematically showing an example of an organic sensor according to some example embodiments.
Figure 6:
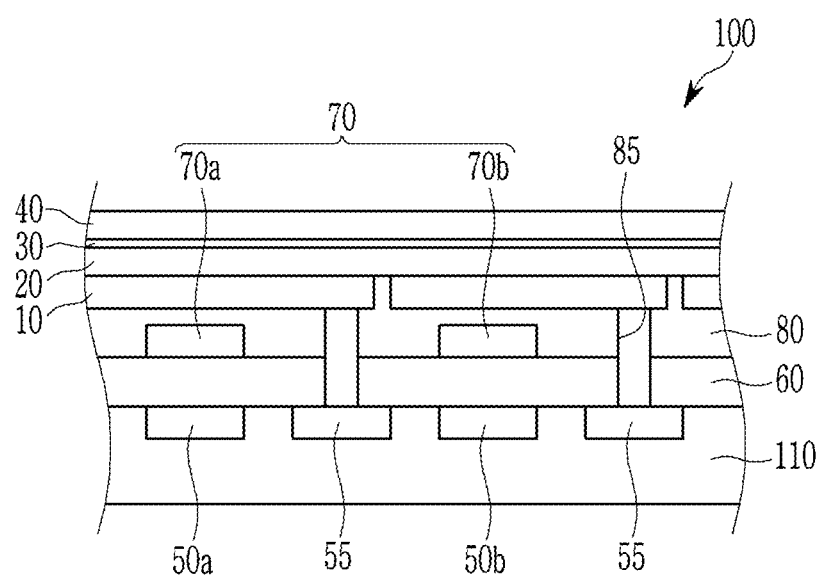
FIG. 6 is a cross-sectional view schematically showing an example of the organic sensor of FIG. 5.
Figure 7:
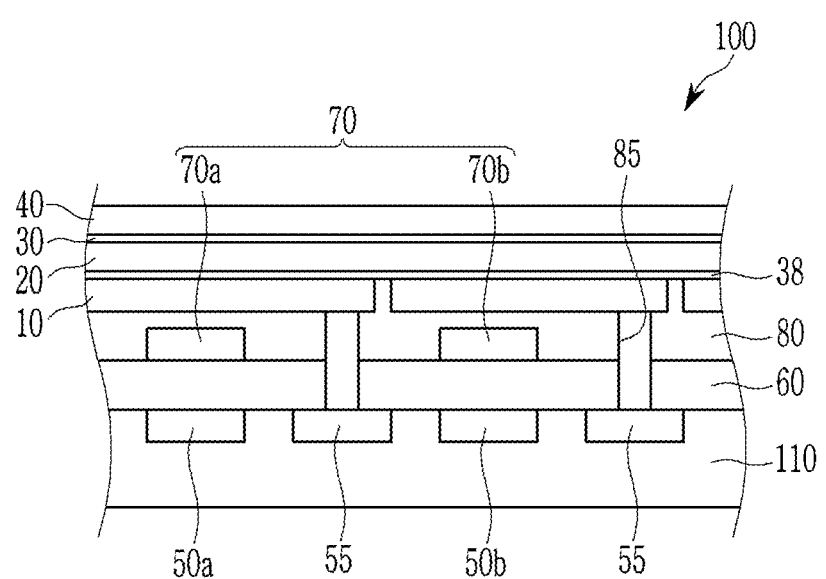
FIG. 7 is a cross-sectional view schematically showing an example of the organic sensor of FIG. 5.

FIG. 5 is a top plan view schematically showing an example of an organic sensor according to some example embodiments and FIGS. 6 and 7 are cross-sectional views schematically showing examples of the organic sensor of FIG. 5.

Referring to FIGS. 5 and 6, the organic sensor 100 according to some example embodiments includes a semiconductor substrate 110, a first electrode 10, an organic active layer 20, a protective layer 30, and a second electrode 40, like the example embodiments shown in at least FIG. 3.

The semiconductor substrate 110 may be a silicon substrate, and is integrated with the photo-sensing devices 50a and 50b, the transmission transistor (not shown), and the charge storage 55. The photo-sensing devices 50a and 50b may be photodiodes. The charge storage 55 may electrically be connected to the first electrode 10 and the information of the charge storage 55 may be transferred by the transmission transistor.

The photo-sensing devices 50a and 50b, the transmission transistor, and/or the charge storage 55 may be integrated in each pixel, and as shown in the drawing, the photo-sensing devices 50a and 50b may be respectively included in a blue pixel and a red pixel and the charge storage 55 may be included in a green pixel.

A metal wire (not shown) and a pad (not shown) are formed on the semiconductor substrate 110. In order to decrease signal delay, the metal wire and pad may be made of a metal having low resistivity, for example, aluminum (Al), copper (Cu), silver (Ag), and alloys thereof, but are not limited thereto. Further, it is not limited to the structure, and the metal wire and pad may be disposed under the photo-sensing devices 50a and 50b.

The lower insulation layer 60 is formed on the metal wire and the pad. The lower insulation layer 60 may be made of an inorganic insulating material such as a silicon oxide and/or a silicon nitride, or a low dielectric constant (low K) material such as SiC, SiCOH, SiCO, and SiOF. The lower insulation layer 60 has a trench 85 exposing the charge storage 55. The trench 85 may be filled with fillers.

A color filter layer 70 is formed on the lower insulation layer 60. The color filter layer 70 includes a blue filter 70a formed in a blue pixel and a red filter 70b in a red pixel. In some example embodiments, a green filter is not included, but a green filter may be further included. For another example, the color filter layer 70 may be disposed on the second electrode 40. In some example embodiments, the color filter layer 70 may be omitted from the image sensor 100 of FIGS. 5-7, and the photo-sensing devices 50a and 50b may be configured to selectively detect (e.g., absorb) different wavelength regions of incident light independently of the incident light being filtered prior to being incident upon the photo-sensing devices 50a and 50b.

The upper insulation layer 80 is formed on the color filter layer 70. The upper insulation layer 80 may eliminate a step caused by the color filter layer 70 and smoothen the surface. The upper insulation layer 80 and the lower insulation layer may include a contact hole (not shown) exposing a pad, and a trench 85 trench 85.

The aforementioned first electrode 10, organic active layer 20, protective layer and second electrode 40 are formed on the upper insulation layer 80. The first electrode 10, organic active layer 20, protective layer 30, and second electrode 40 are the same as described above.

Focusing lens (not shown) may be further formed on the second electrode 40. The focusing lens may control a direction of incident light and gather the light in one region. The focusing lens may have a shape of, for example, a cylinder or a hemisphere, but is not limited thereto.

Referring to FIG. 7, the organic sensor 100 according to some example embodiments includes a semiconductor substrate 110, a lower insulation layer 60, a color filter layer 70, an upper insulation layer 80, a first electrode 10, an organic active layer 20, a protective layer 30, and a second electrode 40. The semiconductor substrate 110, lower insulation layer 60, color filter layer 70, upper insulation layer 80, first electrode 10, organic active layer 20, protective layer 30, and second electrode are the same as described above, respectively.

In some example embodiments, the organic sensor 100 according to some example embodiments further includes a charge auxiliary layer 38 between the first electrode 10 and the organic active layer 20. The charge auxiliary layer 38 may be a charge transport layer and/or s charge blocking layer as described above, and the detailed descriptions thereof are the same as described above.

The aforementioned organic sensor may be applied to various electronic devices, for example mobile phones, digital cameras, automotive electron parts, but are not limited thereto.

Figure 9:
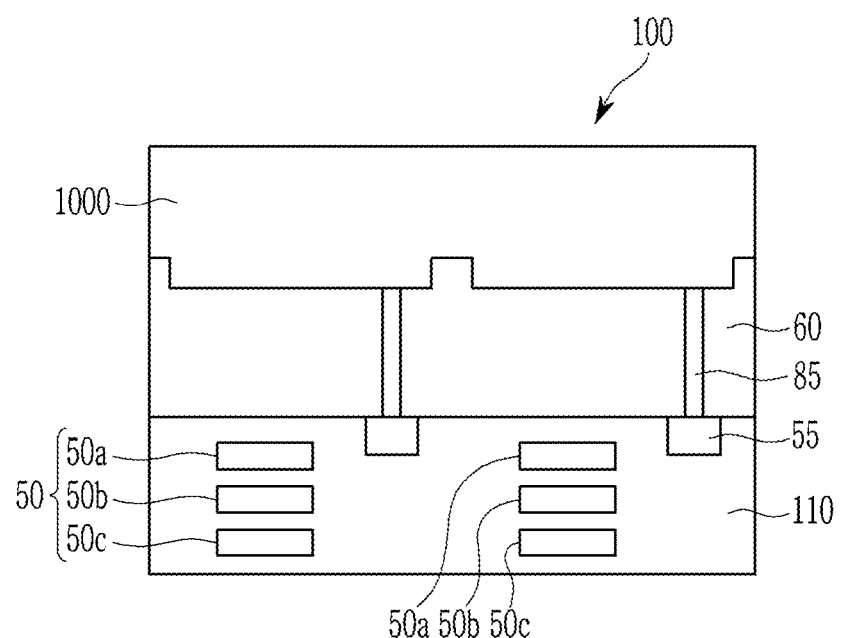
FIG. 9 is a cross-sectional view showing an organic sensor according to some example embodiments.

FIG. 9 is a cross-sectional view showing an organic sensor according to some example embodiments.

As shown in FIG. 9, an organic sensor 100 according to some example embodiments includes a semiconductor substrate 110 integrated with a light sensor that include photo-sensing devices (e.g., diodes) 50a, 50b, and 50c, a transmission transistor (not shown), and a charge storage 55, an insulation layer 60 having a trench and an organic sensor 1000. The organic sensor 1000 shown in FIG. 9 may be any of the example embodiments of organic sensors 100 described herein.

In the organic sensor 100 according to some example embodiments, the photo-sensing devices 50a, 50b, 50c (which may each be configured to sense a different wavelength region of visible light) are stacked in a vertical direction and the color filter layer 70 is omitted. The photo-sensing devices 50a, 50b, 50c are electrically connected to charge storage (not shown) and may be transferred by the transmission transistor. The photo-sensing devices 50a, 50b, 50c may selectively absorb light in separate, respective wavelength spectra of light depending on a stack depth of the respective photo-sensing devices 50a, 50b, 50c. Other structures are the same as the organic sensor 100 of FIGS. 1-7.

Figure 10:
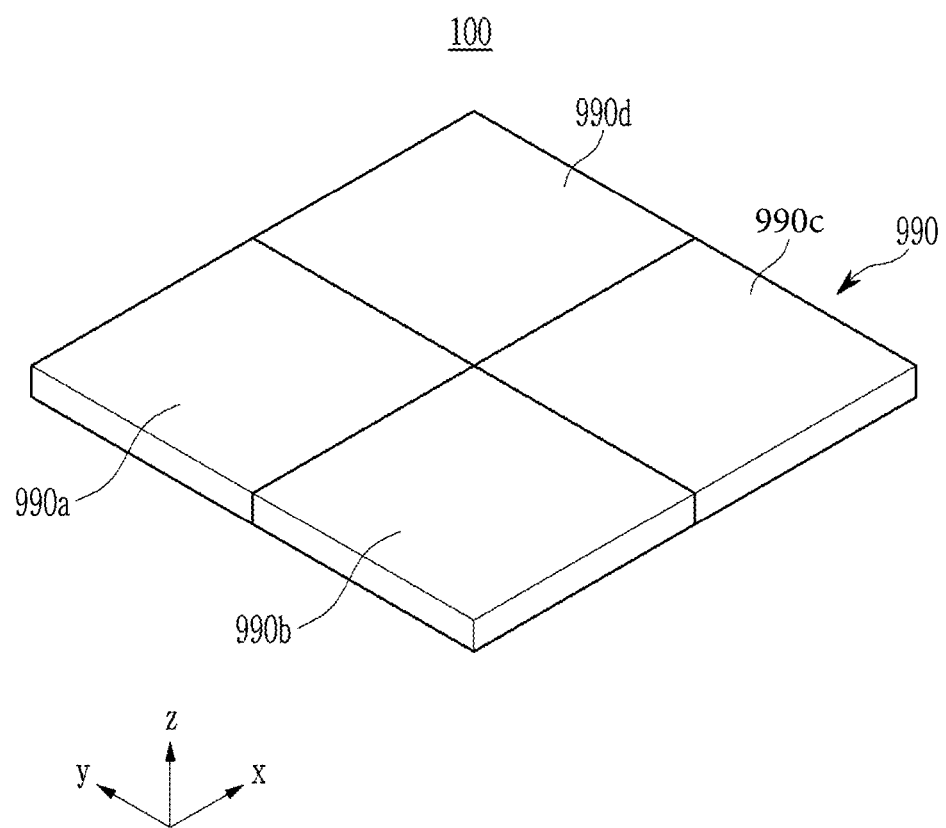
FIG. 10 is a perspective view of an organic sensor according to some example embodiments.
Figure 11:
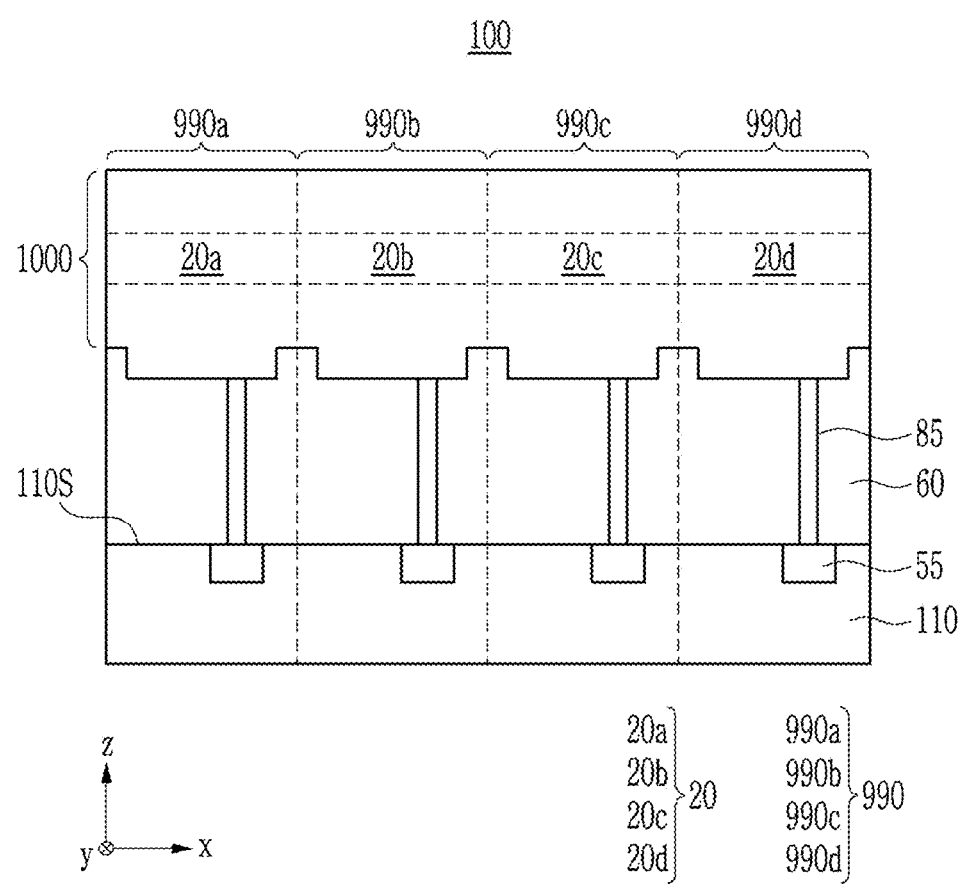
FIG. 11 is a schematic cross-sectional view showing the organic sensor of FIG. 10, according to some example embodiments.

FIG. 10 is a perspective view of an organic sensor according to some example embodiments. FIG. 11 is a schematic cross-sectional view showing the organic sensor of FIG. 10, according to some example embodiments.

As shown with reference to FIGS. 10-11, an organic sensor 100 may include a sensor 990 that includes a plurality of organic sensors 990a, 990b, 990c, 990d on a semiconductor substrate 110, where the plurality of organic sensors 990a, 990b, 990c, 990d are configured to absorb and convert different ones of blue light, green light, red light, infrared light, and/or ultraviolet light (i.e., different wavelength spectra of incident light) into electric signals, respectively. It will be understood that, as shown in FIGS. the organic sensor 100 may include a plurality of organic sensors 990*a*, 990*b*, 990*c*, 990*d* that are stacked horizontally on the semiconductor substrate 110, such that the plurality of organic sensors 990*a*, 990*b*, 990*c*, 990*d* overlap each other in a direction extending parallel to a top surface 110S of the semiconductor substrate 110. Organic sensors 990*a*, 990*b*, 990*c*, 990*d* may each be referred to herein as simply a "sensor."

Referring to FIG. 11, an organic sensor 100 according to some example embodiments includes a semiconductor substrate 110 integrated with charge storages transmission transistors (not shown), an insulation layer 60, and organic sensors 990*a*, 990*b*, 990*c*, 990*d*.

As shown with reference to FIGS. 10-11, an organic sensor 100 may include a sensor 990 that itself includes a plurality of organic sensors 990*a*, 990*b*, 990*c*, 990*d* on a semiconductor substrate 110, where the plurality of organic sensors 990*a*, 990*b*, 990*c*, 990*d* are configured to absorb and convert different ones of blue light, green light, red light, infrared light, and/or ultraviolet light (i.e., different wavelength spectra of incident light) into electric signals, respectively. As shown in FIG. 11, the separate organic sensors 990*a*, 990*b*, 990*c*, 990*d* may be horizontally arranged on the semiconductor substrate 110 such that the organic sensors 990*a*, 990*b*, 990*c*, 990*d* are partially or entirely overlapped with each other in a direction that extends in parallel with a top surface 110S of the semiconductor substrate 110 (e.g., the X-direction and/or Y-direction). As shown, each separate organic sensor 990*a*, 990*b*, 990*c*, 990*d* is connected to a separate charge storage 55 that is integrated into the semiconductor substrate 110 via a separate trench 85.

Each organic sensor 990*a*, 990*b*, 990*c*, 990*d* may be any one of the organic sensors 100 described herein. In some example embodiments, separate organic sensors 990*a*, 990*b*, 990*c*, 990*d* may include different portions of a common, continuous layer (e.g., a common second electrode 40, protective layer 30, etc.) that extends continuously between two or more of the organic sensors 990*a*, 990*b*, 990*c*, 990*d*. As shown in FIG. 11, for example, the organic sensors 990*a*, 990*b*, 990*c*, 990*d* include separate portions of an organic sensor 1000, where each separate organic sensor 990*a*, 990*b*, 990*c*, 990*d* may be any of the example embodiments of organic sensors 100 described herein, that includes one or more organic active layers 20*a*, 20*c*, 20*d* that collectively comprise an organic active layer 20 of the organic sensor 1000. In some example embodiments, including the example embodiments shown in FIG. 11, the organic sensors 990*a*, 990*b*, 990*c*, 990*d* may share one or more common electrodes (e.g., electrodes 10 and 40 as described with reference to any example embodiments herein). In another example, two or more of the organic sensors 990*a*, 990*b*, 990*c*, 990*d* may have different organic active layers 20*a*, 20*b*, 20*d* that are configured to absorb different wavelength spectra of incident light. Other structures are the same as the organic sensor 100 of FIGS. 1-7.

Figure 12:
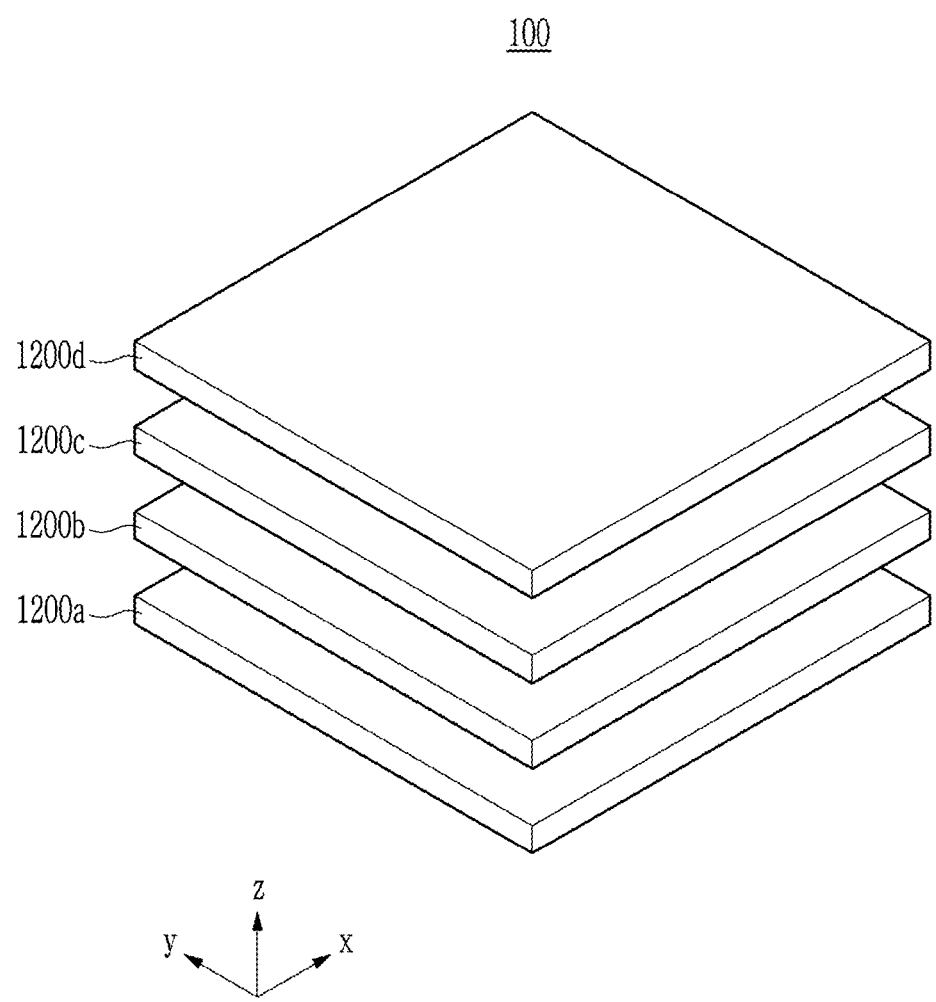
FIG. 12 is a perspective view of a sensor according to some example embodiments.
Figure 13:
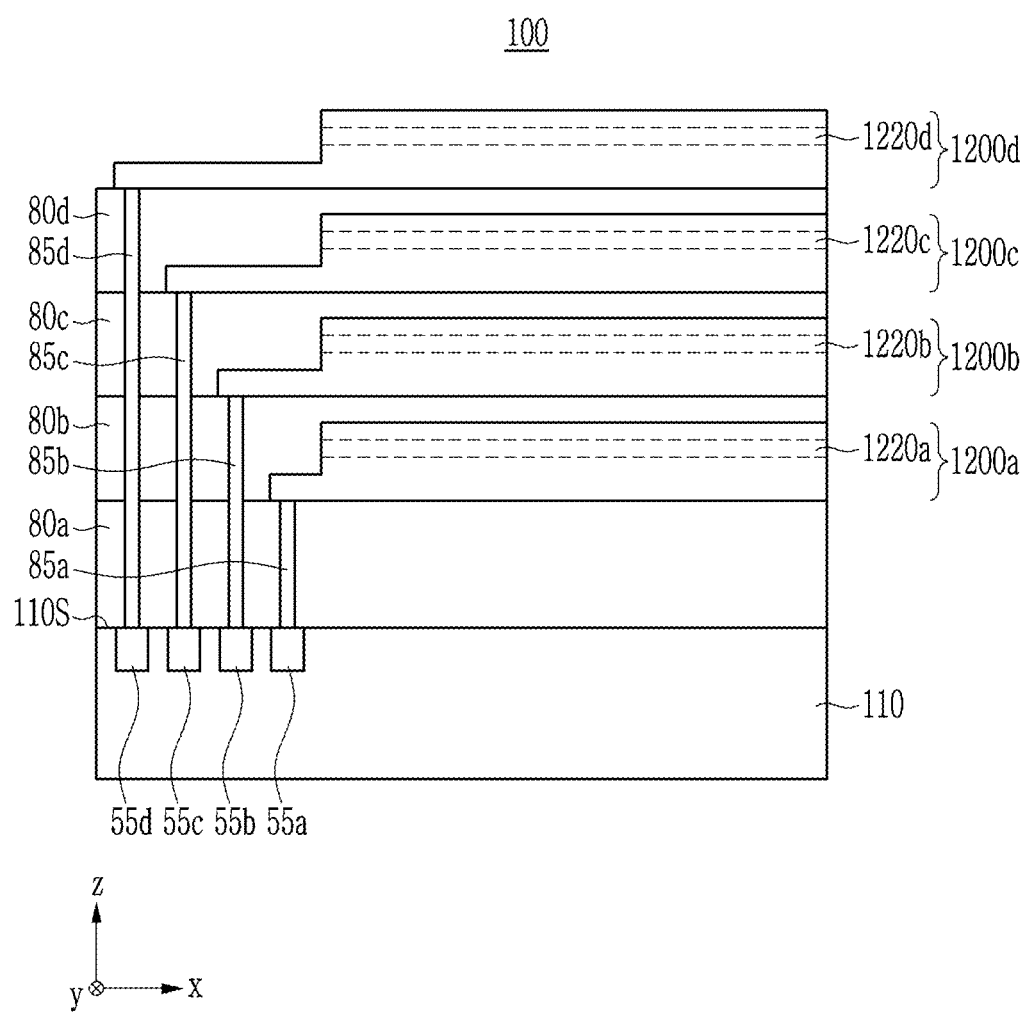
FIG. 13 is a schematic cross-sectional view showing the sensor of FIG. 12 according to some example embodiments.

FIG. 12 is a perspective view of a sensor according to some example embodiments, and FIG. 13 is a schematic cross-sectional view showing the sensor of FIG. 12 according to some example embodiments.

Referring to FIGS. 11-12, the organic sensor 100 according to some example embodiments may include an infrared/near infrared organic sensor configured to selectively absorb light in an infrared/near infrared wavelength spectrum of light, a red organic sensor configured to selectively absorb and convert (into electric signals) light in a red wavelength spectrum of incident light, a green organic sensor configured to selectively absorb and convert (into electric signals) light in a green wavelength spectrum of incident light, a blue organic sensor configured to selectively absorb and convert (into electric signals) light in a blue wavelength spectrum of incident light, and they are stacked in the vertical direction (e.g., Z-direction). Accordingly, it will be understood that, as shown in FIGS. 12-13, the organic sensor 100 may include a plurality of organic sensors 1200*a*-1200*d* that are stacked vertically on the semiconductor substrate 110, such that the plurality of organic sensors 1200*a*-1200*d* overlap each other in a direction extending perpendicular to a top surface 110S of the semiconductor substrate 110. Organic sensors 1200*a*-1200*d* may each be referred to herein as simply a "sensor." It will be understood that each of organic sensors 1200*a*-1200*d* may be any one of the organic sensors 100 described herein, and the organic active layers 1220*a*-1220*d* of the organic sensors 1200*a*-1200*d* may each be any one of the organic active layers 20 described herein.

The organic sensor 100 according to some example embodiments includes a semiconductor substrate 110, a lower insulation layer 80*a*, an intermediate insulation layer 80*b*, another intermediate insulation layer 80*c*, an upper insulation layer 80*d*, a first organic sensor 1200*a*, a second organic sensor 1200*b*, a third organic sensor 1200*c*, and a fourth organic sensor 1200*d*. As shown, the first to fourth organic sensors 1200*a* to 1200*d* are stacked vertically on the semiconductor substrate 110, such that the first to fourth organic sensors 1200*a* to 1200*d* overlap each other in a direction extending perpendicular to a top surface 110S of the semiconductor substrate 110.

The semiconductor substrate 110 may be a silicon substrate, and is integrated with the transmission transistor (not shown) and charge storages.

The first organic sensor 1200*a* is formed on the lower insulation layer 80*a*. The first organic sensor 1200*a* includes an organic active layer 1220*a*. The first organic sensor 1200*a* may be any one of the organic sensors 100 described herein. The organic active layer 1220*a*, which may be any one of the organic active layers 20 described herein, may selectively absorb and convert (into electric signals) light in one of infrared, red, blue, and green wavelength spectra of incident light. For example, the first organic sensor 1200*a* may be a blue organic sensor.

An intermediate insulation layer 80*b* is formed on the first organic sensor 1200*a*.

The second organic sensor 1200*b* is formed on the intermediate insulation layer 80*b*. The second organic sensor 1200*b* includes an organic active layer 1220*b*. The second organic sensor 1200*b* may be any one of the organic sensors described herein. The organic active layer 1220*b*, which may be any one of the organic active layers 20 described herein, may selectively absorb and convert (into electric signals) light in one of infrared, red, blue, and green wavelength spectra of incident light. For example, the second organic sensor 1200*b* may be a green organic sensor.

Another intermediate insulation layer 80*c* is formed on the second organic sensor 1200*b*.

The third organic sensor 1200*c* is formed on the intermediate insulation layer 80*c*. The third organic sensor 1200*c* includes an organic active layer 1220*c*. The third organic sensor 1200*c* may be any one of the organic sensors described herein. The organic active layer 1220*c*, which may be any one of the organic active layers 20 described herein, may selectively absorb and convert (into electric signals)

light in one of infrared, red, blue, and green wavelength spectra of incident light. For example, the third organic sensor 1200*c* may be a red organic sensor.

The upper insulation layer 80*d* is formed on the third organic sensor 1200*c*.

The lower insulation layer 80*a*, the intermediate insulation layers 80*b* and 80*c*, and the upper insulation layer 80*d* have a plurality of through-holes exposing the charge storages 55*a*, 55*b*, 55*c*, and 55*d*. The sensors 1200*a*-1200*d* may each be electrically coupled to a separate, respective charge storage 55*a*, 55*b*, 55*c*, and 55*d* via a separate, respective trench 85*a*, 85*b*, 85*c*, and 85*d*.

The fourth organic sensor 1200*d* is formed on the upper insulation layer 80*d*. The fourth organic sensor 1200*d* includes an organic active layer 1220*d*. The fourth organic sensor 1200*d* may be any one of the organic sensors described herein. The organic active layer 1220*d*, which may be any one of the organic active layers 20 described herein, may selectively absorb light in one of infrared, red, blue, and green wavelength spectra of light. For example, the fourth organic sensor 1200*d* may be an infrared/near infrared organic sensor.

In the drawing, the first organic sensor 1200*a*, the second organic sensor 1200*b*, the third organic sensor 1200*c*, and the fourth organic sensor 1200*d* are sequentially stacked, but the present disclosure is not limited thereto, and they may be stacked in various orders.

As described above, the first organic sensor 1200*a*, the second organic sensor 1200*b*, the third organic sensor 1200*c*, and the fourth organic sensor 1200*d* have a stack structure, and thus the size of an image sensor 100 may be reduced to realize a down-sized image sensor.

Referring to FIGS. 10-13 in general, where an organic sensor 100 includes a plurality of organic sensors 990*a*-990*d* and/or 1200*a*-1200*d*, in some example embodiments, at least two organic sensors (e.g., 990*a*-990*d* and/or 1200*a*-1200*d*) of the plurality of sensors may have different structures. For example, at least one organic sensor of the plurality of organic sensors 990*a*-990*d* and/or 1200*a*-1200*d* may include the charge auxiliary layer 38 and at least one separate organic sensor of the plurality of organic sensors 990*a*-990*d* and/or 1200*a*-1200*d* may not include the charge auxiliary layer 38. In another example, at least one organic sensor of the plurality of organic sensors 990*a*-990*d* and/or 1200*a*-1200*d* may include a protective layer 30 having a different material composition than a protective layer of a separate organic sensor of the plurality of organic sensors 990*a*-990*d* and/or 1200*a*-1200*d*.

Figure 14:
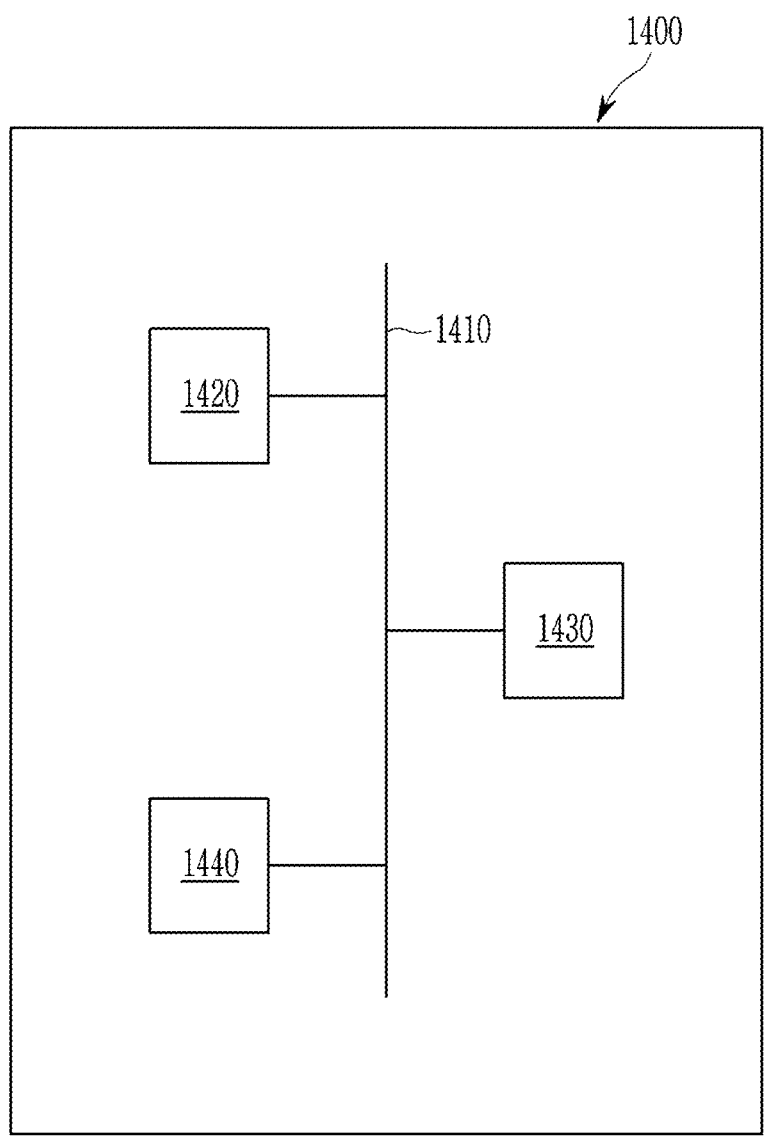
FIG. 14 is a diagram illustrating a device that includes one or more image sensors according to some example embodiments.

FIG. 14 is a diagram illustrating a device that includes one or more image sensors according to some example embodiments.

Referring to FIG. 14, device 1400, which may be an electronic device, includes a bus 1410, a processor 1420, a memory 1430, and one or more image sensors 1440. As shown, in some example embodiments, the processor 1420, a memory 1430, and one or more image sensors 1440 may communicate with one another through the bus 1410.

The one or more image sensors 1440 may each be any of the image sensors 100 included in any of the example embodiments.

The processor 1420 may include one or more instances of processing circuitry such as hardware including logic circuits; a hardware/software combination such as a processor executing software; or a combination thereof. For example, the processing circuitry more specifically may include, but is not limited to, a central processing unit (CPU), an arithmetic logic unit (ALU), a digital signal processor, a microcomputer, a field programmable gate array (FPGA), a System-on-Chip (SoC), a programmable logic unit, a microprocessor, application-specific integrated circuit (ASIC), etc. In some example embodiments, the processing circuitry may include a non-transitory computer readable storage device, for example a solid state drive (SSD), storing a program of instructions, and a processor configured to execute the program of instructions to implement the functionality of the processor 1420 and/or one or more image sensors 1440.

It will be understood that the memory 1430 may store a program of instructions and the processor 1420 may execute the stored program of instructions to implement functionality associated with the device 1400 and/or one or more image sensors 1440, including performing one or more biometric recognition operations.

The methods according to the above-described example embodiments may be recorded in non-transitory computer-readable media including program instructions to implement various operations of the above-described example embodiments. The media may also include, alone or in combination with the program instructions, data files, data structures, and the like. The program instructions recorded on the media may be those specially designed and constructed for the purposes of example embodiments, or they may be of the kind well-known and available to those having skill in the computer software arts. Examples of non-transitory computer-readable media include magnetic media such as hard disks, floppy disks, and magnetic tape; optical media such as CD-ROM discs, DVDs, and/or Blue-ray discs; magneto-optical media such as optical discs; and hardware devices that are specially configured to store and perform program instructions, such as read-only memory (ROM), random access memory (RAM), flash memory (e.g., USB flash drives, memory cards, memory sticks, etc.), and the like. Examples of program instructions include both machine code, such as produced by a compiler, and files containing higher level code that may be executed by the computer using an interpreter. The above-described devices may be configured to act as one or more software modules in order to perform the operations of the above-described example embodiments, or vice versa.

Hereinafter, some example embodiments are illustrated in more detail with reference to examples. However, the present disclosure is not limited to these examples.

Example 1-1

ITO is sputtered on a glass substrate to form a 150 nm-thick anode. On the anode, a compound represented by Chemical Formula A is deposited to form a 5 nm-thick charge auxiliary layer. On the charge auxiliary layer, a p-type semiconductor represented by Chemical Formula B ($\lambda$max: 545 nm) and an n-type semiconductor, fullerene C60 are co-deposited in a volume ratio of 1.25:1 to form a 100 nm-thick organic active layer. On the organic active layer, a compound represented by Chemical Formula C-1 is thermally deposited to form a 5 nm-thick protective layer. On the protective layer, ITO is sputtered to form a 7 nm-thick cathode. On the cathode, aluminum oxide ($Al_2O_3$) is deposited to form a 50 nm-thick anti-reflection layer, and then, a glass plate is used for sealing to manufacture an organic sensor.

[Chemical Formula A]

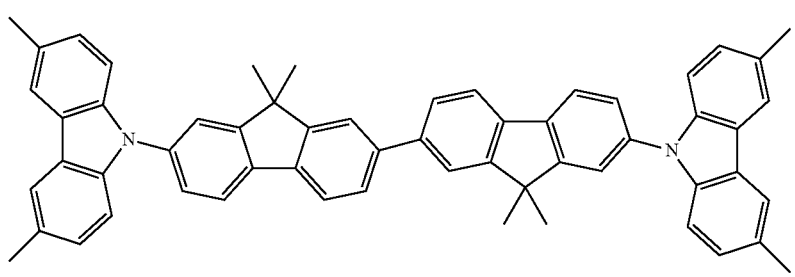

[Chemical Formula B]

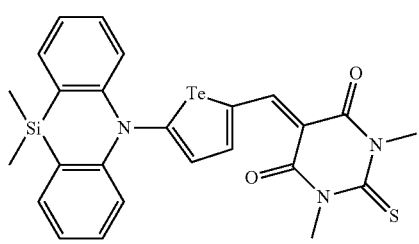

[Chemical Formula C-1]

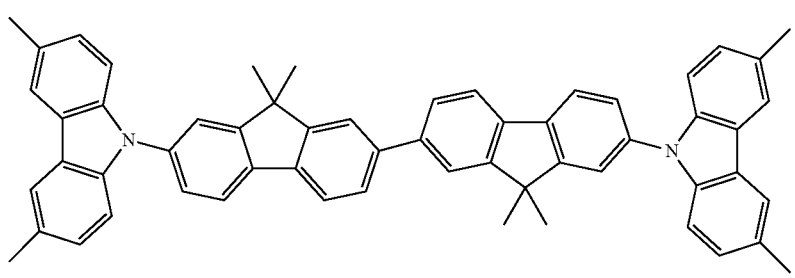

Example 1-2

An organic sensor is manufactured according to the same method as Example 1-1 except that the compound represented by Chemical Formula C-1 is thermally deposited to a 2 nm-thick protective layer.

Example 1-3

An organic sensor is manufactured according to the same method as Example 1-1 except that the compound represented by Chemical Formula C-1 is thermally deposited to form a 1 nm-thick protective layer.

Example 2

An organic sensor is manufactured according to the same method as Example 1-1 except that a compound represented by Chemical Formula C-2, instead of the compound represented by Chemical Formula C-1, is thermally deposited to form a 5 nm-thick protective layer.

[Chemical Formula C-2]

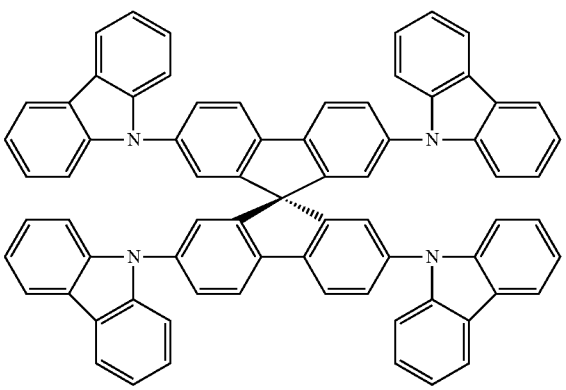

Example 3

An organic sensor is manufactured according to the same method as Example 1-1 except that a compound represented by Chemical Formula C-3, instead of the compound represented by Chemical Formula C-1, is thermally deposited to form a 5 nm-thick protective layer.

[Chemical Formula C-3]

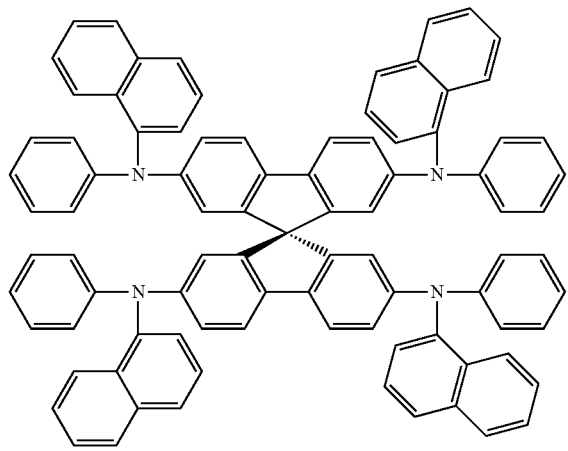

Example 4

An organic sensor is manufactured according to the same method as Example 1-1 except that a compound represented by Chemical Formula C-4, instead of the compound represented by Chemical Formula C-1, is thermally deposited to form a 5 nm-thick protective layer.

[Chemical Formula C-4]

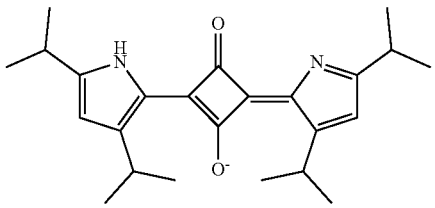

Comparative Example 1

An organic sensor is manufactured according to the same method as Example 1-1 except that the compound represented by Chemical Formula C-1 is thermally deposited to form a 10 nm-thick protective layer.

Comparative Example 2

An organic sensor is manufactured according to the same method as Example 1-1 except that the compound represented by Chemical Formula C-2 is thermally deposited to form a 10 nm-thick protective layer.

Comparative Example 3

An organic sensor is manufactured according to the same method as Example 1-1 except that the compound represented by Chemical Formula C-3 is thermally deposited to form a 10 nm-thick protective layer.

Comparative Example 4

An organic sensor is manufactured according to the same method as Example 1-1 except that the compound represented by Chemical Formula C-4 is thermally deposited to form a 10 nm-thick protective layer.

Comparative Example 5

An organic sensor is manufactured according to the same method as Example 1-1 except that the protective layer is not formed.

Evaluation I

The organic sensors according to Examples and Comparative Examples are evaluated with respect to capacitance of an anode/protective layer/cathode structure.

The capacitance is obtained by measuring real and imaginary parts of impedance with an impedance analyzer (SP-200, Biologic Science Instruments), while a frequency is changed and then, fitting the measurements with an equivalent circuit of $R_1+C_2/R_2$. Herein, $R_1$ is contact resistance, and $C_2$ and $R_2$ are respectively capacitance and resistance of the protective layer.

The results are shown in Table 1.

TABLE 1

|  | Capacitance (F) |
|---|---|
| Example 1-1 | $6.6 \times 10^{-11}$ |
| Example 1-2 | $2.6 \times 10^{-11}$ |
| Example 1-3 | $6.6 \times 10^{-12}$ |
| Example 2 | $1.1 \times 10^{-10}$ |
| Example 3 | $6.5 \times 10^{-11}$ |
| Example 4 | $1.2 \times 10^{-10}$ |
| Comparative Example 1 | $8.1 \times 10^{-9}$ |
| Comparative Example 2 | $1.1 \times 10^{-8}$ |
| Comparative Example 3 | $8.2 \times 10^{-9}$ |
| Comparative Example 4 | $1.3 \times 10^{-8}$ |
| Comparative Example 5 | — |

Referring to Table 1, the organic sensors according to Examples exhibit low capacitance compared with the organic sensors according to Comparative Examples.

Evaluation II

Efficiency of the organic sensors according to Examples and Comparative Examples is evaluated.

The efficiency of the organic sensors is evaluated by using external quantum efficiency (EQE), specifically, in an Incident Photon to Current Efficiency (IPCE) method in a wavelength region ranging from 400 nm to 720 nm.

The results are shown in Table 2.

TABLE 2

|  | Efficiency (EQE, R/G/B, %) |
|---|---|
| Example 1-1 | 18.8/71.9/24.3 |
| Example 1-2 | 18.3/68.7/23.4 |
| Example 1-3 | 18.3/68.7/23.2 |
| Example 2 | 18.9/72.0/24.4 |
| Example 3 | 18.8/71.9/24.2 |
| Example 4 | 18.2/69.1/23.6 |
| Comparative Example 1 | 13.6/48.3/18.2 |
| Comparative Example 2 | 12.6/46.5/17.3 |
| Comparative Example 3 | 15.6/60.2/19.6 |
| Comparative Example 4 | 12.7/44.5/16.5 |
| Comparative Example 5 | 17.5/67.8/22.4 |

** R: 600 nm, G: 545 nm, B: 450 nm

Referring to Table 2, the organic sensors according to Examples exhibit high efficiency compared with the organic sensors according to Comparative Examples. Accordingly, by the protective layer, the organic sensors according to Examples may reduce or prevent or suppress deterioration of the organic active layer and thus performance deterioration of the organic sensors.

While this disclosure has been described in connection with what is presently considered to be practical example embodiments, it is to be understood that the inventive concepts are not limited to the disclosed example embodiments, but, on the contrary, is intended to cover various modifications and equivalent arrangements included within the spirit and scope of the appended claims.

What is claimed is:

1. An organic sensor, comprising:
    a first electrode,
    a second electrode,
    an organic active layer between the first electrode and the second electrode, and
    a protective layer between the organic active layer and the second electrode,
    wherein a capacitance of the first electrode, the protective layer, and the second electrode is less than or equal to about $2\times10^{-10}$ F,
    wherein the protective layer includes at least one hole extending fully through a thickness of the protective layer between opposite surfaces of the protective layer,
    wherein the protective layer includes
        an organic material represented by Chemical Formula 2A:

[Chemical Formula 2A]

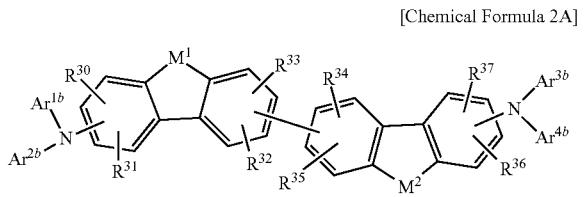

wherein, in Chemical Formula 2A:
    $M^1$ and $M^2$ are each independently $CR''R^o$, $SiR^pR^q$, $NR^r$, O, S, Se, or Te, wherein $R''$ to $R^r$ are each independently hydrogen, a substituted or unsubstituted C1 to C30 alkyl group, a substituted or unsubstituted C6 to C30 aryl group, a substituted or unsubstituted C3 to C30 heterocyclic group, a substituted or unsubstituted C1 to C6 alkoxy group, a halogen, or a cyano group,
    $Ar^{1b}$ to $Ar^{4b}$ are each independently a substituted or unsubstituted C6 to C30 aryl group, or a substituted or unsubstituted C3 to C30 heteroaryl group,
    $Ar^{1b}$ and $Ar^{2b}$, and $Ar^{3b}$ and $Ar^{4b}$ are each independently present or linked with each to form a ring, and
    $R^{30}$ to $R^{37}$ are each independently hydrogen, a substituted or unsubstituted C1 to C30 alkyl group, a substituted or unsubstituted C6 to C30 aryl group, a substituted or unsubstituted C3 to C30 heterocyclic group, a substituted or unsubstituted C1 to C6 alkoxy group, a halogen, or a cyano group.

2. The organic sensor of claim 1, wherein the thickness of the protective layer is not uniform.

3. The organic sensor of claim 2, wherein a greatest thickness of the protective layer is about 1 nm to about 4 nm.

4. The organic sensor of claim 1, wherein a portion of the organic active layer is in contact with the second electrode.

5. The organic sensor of claim 1, wherein the protective layer includes a substance including molecules having a molecular weight ranging from about 50 Da to about 5,000 Da.

6. The organic sensor of claim 1, wherein the second electrode is a sputtered electrode.

7. The organic sensor of claim 6, wherein the second electrode is a sputtered conductive oxide electrode.

8. The organic sensor of claim 1, wherein the capacitance of the first electrode, the protective layer, and the second electrode is about $1\times10^{-13}$ F to about $2\times10^{-10}$ F.

9. The organic sensor of claim 1, wherein the organic active layer is a photoelectric conversion layer that is configured to absorb light in at least a portion of a wavelength region and convert the absorbed light into an electric signal.

10. The organic sensor of claim 1, further comprising a semiconductor substrate on the first electrode such that the first electrode is between the semiconductor substrate and the organic active layer.

11. An electronic device comprising the organic sensor of claim 1.

12. A method of manufacturing an organic sensor, the method comprising:
    forming a first electrode,
    forming an organic active layer on the first electrode,
    forming a protective layer on the organic active layer, and
    forming a second electrode on the protective layer by sputtering,
    wherein a capacitance of the first electrode, the protective layer, and the second electrode is less than or equal to about $2\times10^{-10}$ F,
    wherein the forming of the second electrode includes removing a portion of one or more surfaces of the protective layer such that the protective layer is formed with at least one hole extending fully through a thickness of the protective layer between opposite surfaces of the protective layer,
    wherein the protective layer includes an organic material represented by Chemical Formula 2A:

[Chemical Formula 2A]

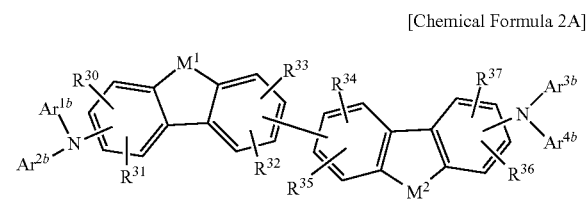

wherein, in Chemical Formula 2A,
    $M^1$ and $M^2$ are each independently $CR''R^o$, $SiR^pR^o$, $NR^r$, O, S, Se, or Te, wherein $R''$ to $R^r$ are each independently hydrogen, a substituted or unsubstituted C1 to C30 alkyl group, a substituted or unsubstituted C6 to C30 aryl group, a substituted or unsubstituted C3 to C30 heterocyclic group, a substituted or unsubstituted C1 to C6 alkoxy group, a halogen, or a cyano group,
    $Ar^{1b}$ to $Ar^{4b}$ are each independently a substituted or unsubstituted C6 to C30 aryl group, or a substituted or unsubstituted C3 to C30 heteroaryl group,
    $Ar^{1b}$ and $Ar^{2b}$, and $Ar^{3b}$ and $Ar^{4b}$ are each independently present or linked with each to form a ring, and
    $R^{30}$ to $R^{37}$ are each independently hydrogen, a substituted or unsubstituted C1 to C30 alkyl group, a substituted or unsubstituted C6 to C30 aryl group, a substituted or unsubstituted C3 to C30 heterocyclic group, a substituted or unsubstituted C1 to C6 alkoxy group, a halogen, or a cyano group.

13. The method of claim 12, wherein the protective layer is formed such that the thickness of the protective layer is about 1 nm to 6 nm.

14. The method of claim 12, wherein the forming of the protective layer includes thermal deposition of an organic material, a carbon-containing material, or a combination thereof on the organic active layer.

15. An organic sensor, comprising:
a semiconductor substrate; and
a plurality of sensors on the semiconductor substrate, each separate sensor of the plurality of sensors including
a first electrode,
a second electrode,
an organic active layer between the first electrode and the second electrode, and
a protective layer between the organic active layer and the second electrode,
wherein a capacitance of the first electrode, the protective layer, and the second electrode is less than or equal to about $2 \times 10^{-10}$ F,
wherein the protective layer includes at least one hole extending fully through a thickness of the protective layer between opposite surfaces of the protective layer,
wherein the protective layer includes
an organic material represented by Chemical Formula 2A:

[Chemical Formula 2A]

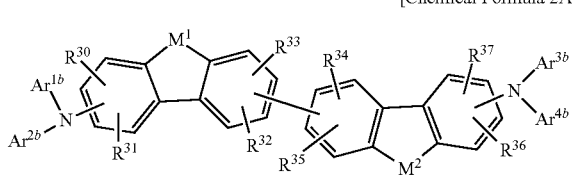

wherein, in Chemical Formula 2A,
$M^1$ and $M^2$ are each independently $CR''R^o$, $SiR^pR^o$, $NR^r$, O, S, Se, or Te, wherein $R''$ to $R^r$ are each independently hydrogen, a substituted or unsubstituted C1 to C30 alkyl group, a substituted or unsubstituted C6 to C30 aryl group, a substituted or unsubstituted C3 to C30 heterocyclic group, a substituted or unsubstituted C1 to C6 alkoxy group, a halogen, or a cyano group,
$Ar^{1b}$ to $Ar^{4b}$ are each independently a substituted or unsubstituted C6 to C30 aryl group, or a substituted or unsubstituted C3 to C30 heteroaryl group,
$Ar^{1b}$ and $Ar^{2b}$, and $Ar^{3b}$ and $Ar^{4b}$ are each independently present or linked with each to form a ring, and
$R^{30}$ to $R^{37}$ are each independently hydrogen, a substituted or unsubstituted C1 to C30 alkyl group, a substituted or unsubstituted C6 to C30 aryl group, a substituted or unsubstituted C3 to C30 heterocyclic group, a substituted or unsubstituted C1 to C6 alkoxy group, a halogen, or a cyano group.

16. The organic sensor of claim 15, wherein each separate sensor of the plurality of sensors is configured to absorb and convert a different wavelength region of incident light into electric signals.

17. The organic sensor of claim 16, wherein the plurality of sensors are stacked vertically on the semiconductor substrate, such that the plurality of sensors overlap each other in a direction extending perpendicular to a top surface of the semiconductor substrate.

18. The organic sensor of claim 16, wherein the plurality of sensors are arranged horizontally on the semiconductor substrate, such that the plurality of sensors overlap each other in a direction extending parallel to a top surface of the semiconductor substrate.

19. An electronic device comprising the organic sensor of claim 15.

\* \* \* \* \*